(12) United States Patent
Lang

(10) Patent No.: US 9,711,705 B2
(45) Date of Patent: Jul. 18, 2017

(54) SYSTEMS, METHODS AND/OR APPARATUS FOR THERMOELECTRIC ENERGY GENERATION

(75) Inventor: Daniel Stewart Lang, Las Vegas, NV (US)

(73) Assignee: Electron Holding LLC, Las Vegas, NV (US)

( * ) Notice: Subject to any disclaimer, the term of this patent is extended or adjusted under 35 U.S.C. 154(b) by 88 days.

(21) Appl. No.: 13/885,975

(22) PCT Filed: Nov. 16, 2011

(86) PCT No.: PCT/US2011/060937
§ 371 (c)(1),
(2), (4) Date: Jun. 21, 2013

(87) PCT Pub. No.: WO2012/068218
PCT Pub. Date: May 24, 2012

(65) Prior Publication Data
US 2013/0269741 A1    Oct. 17, 2013

Related U.S. Application Data

(60) Provisional application No. 61/532,104, filed on Sep. 8, 2011, provisional application No. 61/413,995, filed on Nov. 16, 2010.

(51) Int. Cl.
*H01L 35/28* (2006.01)
*H01L 35/30* (2006.01)
*F21S 4/00* (2016.01)

(52) U.S. Cl.
CPC ............... *H01L 35/28* (2013.01); *F21S 4/00* (2013.01); *H01L 35/30* (2013.01)

(58) Field of Classification Search
CPC .......... H01L 35/00; H01L 35/28; H01L 35/30
See application file for complete search history.

(56) References Cited

U.S. PATENT DOCUMENTS 4,251,291 A    2/1981    Gomez
5,901,572 A    5/1999    Peiffer et al.
(Continued)

FOREIGN PATENT DOCUMENTS

WO    WO2011/119413    9/2011

OTHER PUBLICATIONS

International Search Report dated Jul. 16, 2013 for PCT/US2012/65170.
(Continued)

*Primary Examiner* — Jayne Mershon
(74) *Attorney, Agent, or Firm* — Jones Day

(57) ABSTRACT

Systems methods and/or apparatus for the conversion of various types of energy into thermal energy that may be stored and/or then converted into electrical energy. The electrical energy may be available on demand and/or at a user's desired power requirements (e.g., power level and/or type). For example, the energy may be available at a particular voltage and either as direct current (DC) energy or alternating current (AC) energy. The electrical energy may be easily transported and therefore available at a user's desired location. For example, the systems, methods and/or devices may eliminate or reduce the need for electricity transmission, at least for certain applications. In exemplary embodiments, the system may include an organic phase change material for storing the thermal energy.

7 Claims, 24 Drawing Sheets

(56) References Cited

U.S. PATENT DOCUMENTS

| | | | |
|---|---|---|---|
| 2003/0066638 A1 | 4/2003 | Qu et al. | |
| 2006/0232891 A1* | 10/2006 | Bushnik et al. | 360/265.6 |
| 2008/0250788 A1 | 10/2008 | Nuel et al. | |
| 2010/0319747 A1* | 12/2010 | Wong et al. | 136/201 |
| 2011/0239635 A1 | 10/2011 | Prior et al. | |
| 2012/0181971 A1 | 7/2012 | Birkeland et al. | |

OTHER PUBLICATIONS

International Search Report dated Apr. 2, 2012 for PCT/US2011/060937.

Rona, Solar Air Conditioning Systems, e-Book [on-line], Dec. 2004 [retrieved on Mar. 5, 2012]. Retrieved from the Internet: <URL:http://services.eng.uts.edu.au/1johnd/Garry's%20Course/07_SolarAir-conditioning_eBookEdition.pdf>.

\* cited by examiner

SYSTEMS, METHODS AND/OR APPARATUS FOR THERMOELECTRIC ENERGY GENERATION

CROSS-REFERENCE TO RELATED APPLICATIONS

This application is the National Phase application of International Application No. PCT/US2011/060937, filed Nov. 16, 2011, which designates the United States and was published in English, which claims priority to U.S. Provisional Application No. 61/413,995, filed on Nov. 16, 2010 and U.S. Provisional Application No. 61/532,104, filed Sep. 8, 2011. This application is also related to PCT Application No. PCT/US2011/060942, entitled "Systems, Methods and/or Devices for Providing LED Lighting", filed on Nov. 16, 2011. Each of these applications are herein incorporated by reference in their entirety.

FIELD

This disclosure generally relates to generally to the conversion of a thermal energy into electrical energy. This disclosure is also generally related to the conversion of a temperature difference into electrical energy.

BACKGROUND

It is becoming more important to reduce the amount of energy generated by consumable heat source power plants, (e.g., natural gas, coal, fossil fuel, nuclear, etc.) and replace them with renewable and/or clean energy sources.

A challenge faced by current renewable clean energy technologies is that they are almost as, and in some cases more, complicated than the legacy technologies they are attempting to replace. Most of these technologies are focused on alternative generation of electricity and they miss the fact that most of the inefficiencies in getting the energy to the customer occur along the countless steps between the conversion into electrical energy and the actual use of the energy.

Factoring in the energy consumed developing, deploying and maintaining both the new and old technologies there is no return our investment in any of them.

There is a need for improved systems, devices, and/or method directed to localized, sustainable, and/or renewable clean energy that can be stored more efficiently and then converted into electrical energy when desired. The present disclosure is directed to overcome and/or ameliorate at least one of the disadvantages of the prior art as will become apparent from the discussion herein.

SUMMARY

Exemplary embodiments relate to the conversion of various types of energy into thermal energy that may be stored and/or then converted into electrical energy. In exemplary embodiments the electrical energy may be available on demand and/or at a user's desired power requirements (e.g., power level and/or type). For example, the energy may be available at a particular voltage and either as direct current (DC) energy or alternating current (AC) energy.

In exemplary embodiments, the electrical energy may be easily transported and therefore available at a user's desired location. For example, in exemplary embodiments, the systems, methods and/or devices may eliminate or reduce the need for electricity transmission, at least for certain applications.

In exemplary embodiments, the thermal energy may be locally stored.

In exemplary embodiments, the system may include an organic phase change material for storing the thermal energy.

In exemplary embodiments, two thermal mass types (hot and cold) may be used and in exemplary embodiments, one or both of the materials may be pre-charged and provided to a user in a state ready for ready for consumption by an end user.

In exemplary embodiments a system for converting thermal energy into electrical energy may comprise: a thermoelectric generator; a high temperature storage in contact with a first side of the thermoelectric generator; a low temperature storage in contact with a second side of the thermoelectric generator; a high temperature regenerator for maintaining the high temperature storage at a high temperature; and a low temperature regenerator for maintaining the low temperature storage at a low temperature. The difference in the temperatures of the high temperature storage and the low temperature storage creates a thermal difference between the two sides of the thermoelectric generator which creates the electrical energy.

In exemplary embodiments, the high temperature storage and low temperature storage are phase change materials.

In exemplary embodiments, the electrical energy is DC current.

In exemplary embodiments, the high temperature regenerator comprises: a thermoelectric generator that uses the high temperature storage on one side and an ambient temperature on the other side to create a temperature difference across the thermoelectric generator. The thermal difference across the thermoelectric generator generates electrical energy.

In exemplary embodiments, the electrical energy of the high temperature regenerator is used to power a heater to keep the high temperature storage at a high temperature.

In exemplary embodiments, the low temperature regenerator comprises: a thermoelectric generator that uses the low temperature storage on one side and an ambient temperature on the other side to create a temperature difference across the thermoelectric generator. The thermal difference across the thermoelectric generator generates electrical energy.

In exemplary embodiments, the electrical energy of the low temperature regenerator is used to power a chiller to keep the low temperature storage at a low temperature.

In exemplary embodiments a system for converting thermal energy into electrical energy may comprise: a thermoelectric generator means for converting a temperature difference into electrical energy; a high temperature storage means for storing thermal energy in contact with a first side of the thermoelectric generator means; a low temperature storage means for storing thermal energy in contact with a second side of the thermoelectric generator means; a high temperature regenerator means for maintaining the high temperature storage means at a high temperature; and a low temperature regenerator means for maintaining the low temperature storage means at a low temperature. The difference in the temperatures of the high temperature storage means and the low temperature storage means creates a thermal difference between the two sides of the thermoelectric generator means which creates the electrical energy.

In exemplary embodiments, the high temperature storage means and low temperature storage means are phase change materials.

In exemplary embodiments, the electrical energy is DC current.

In exemplary embodiments, the high temperature regenerator means comprises: a thermoelectric generator means for converting a temperature difference into electrical energy that uses the high temperature storage means on one side and an ambient temperature on the other side to create a temperature difference across the thermoelectric generator means. The thermal difference across the thermoelectric generator means generates electrical energy.

In exemplary embodiments, the electrical energy of the high temperature regenerator means is used to power a heater means to keep the high temperature storage means at a high temperature.

In exemplary embodiments, the low temperature regenerator means comprises: a thermoelectric generator means for converting a temperature difference into electrical energy that uses the low temperature storage means on one side and an ambient temperature on the other side to create a temperature difference across the thermoelectric generator means. The thermal difference across the thermoelectric generator means for converting a temperature difference into electrical energy generates electrical energy.

In exemplary embodiments, the electrical energy of the low temperature regenerator means for storing thermal energy is used to power a chiller to keep the low temperature storage at a low temperature As well as the embodiments discussed in the summary, other embodiments are disclosed in the specification, drawings and claims. The summary is not meant to cover each and every embodiment, combination or variations contemplated with the present disclosure.

DESCRIPTION OF THE DRAWINGS

Exemplary embodiments will now be described, by way of example only, with reference to the accompanying drawings in which.

DESCRIPTION OF EXEMPLARY EMBODIMENTS

Exemplary embodiments described in the disclosure relate to the conversion of various types of energy into thermal energy that may be stored and/or then converted into electrical energy. As will be readily understood by a person of ordinary skill in the art after reading this disclosure, the exemplary embodiments described herein may be beneficial for environment as well as economic reasons. In exemplary embodiments, the electrical energy may be easily transported and therefore available at a user's desired location reducing transportation costs etc. In exemplary embodiments, the systems, methods and/or devices may eliminate or reduce the need for electricity transmission, at least for certain applications, thereby reducing the need for electricity generation based on fossil fuels. In exemplary embodiments, the thermal energy may be locally stored, thereby making it mobile. In exemplary embodiments, the system may include an organic phase change material for storing the thermal energy, thereby reducing any non-biodegradable waste generated by the system. Additional advantages will be apparent to a person of ordinary skill in the art.

Figure 1:
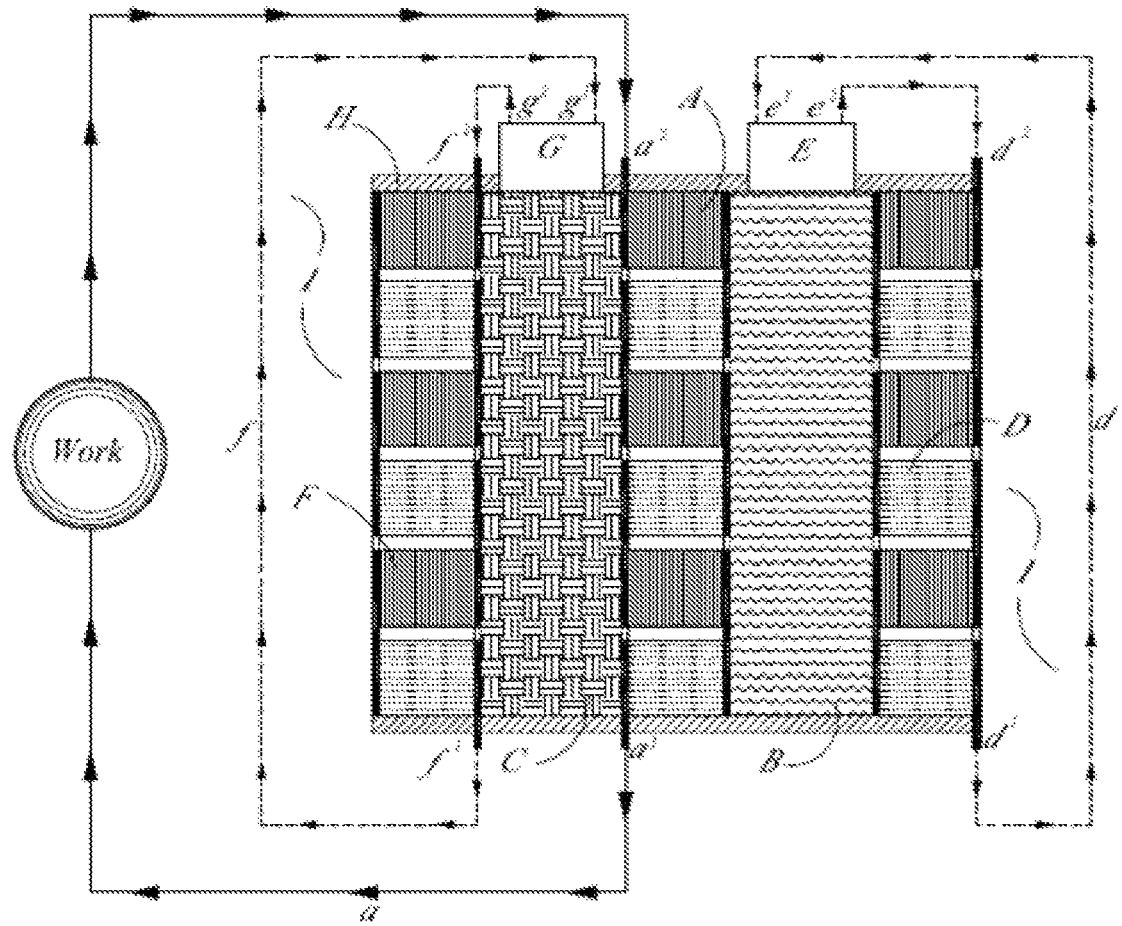
FIG. 1 is a schematic drawing of an exemplary embodiment of a thermoelectric energy generation system.

FIG. 1 is a schematic drawing of an exemplary embodiment of a thermoelectric energy generation system. The system in FIG. 1, includes a thermoelectric generator (A). One side of the thermoelectric generator is placed in contact with a high temperature storage (B) while the other side is placed in contact with a low temperature storage (C). The difference in the temperatures of the high temperature storage (B) and the low temperature storage (C) creates a large thermal difference between the two sides of the thermoelectric generator (A) which creates an electrical output. For example, in the exemplary embodiment of FIG. 1, the electrical output is identified by direct current (a) that flows between positive and negative terminals ($a^1$, $a^2$).

A thermoelectric generator is a device which converts heat (e.g., a temperature difference as described herein) into electrical energy, using a phenomenon called the "thermoelectric effect".

In exemplary embodiments such as the one illustrated in FIG. 1, the high temperature storage (B) may be kept at a high temperature by employing a high temperature regenerator (D). In exemplary embodiments, the high temperature regenerator (D) may comprise a thermoelectric generator ($A^1$). The thermoelectric generator ($A^1$) operates in a substantially similar manner to the thermoelectric generator (A) except it uses the high temperature storage (B) on one side and an ambient temperature (I) on the other side to create a temperature difference across the thermoelectric generator ($A^1$). The thermal difference across thermoelectric generator ($A^1$) creates an electrical output identified by direct current (d). The electrical output of thermoelectric generator ($A^1$) may be used to power heater (E) which may be used to keep high temperature storage (B) at a high temperature.

Similarly, in exemplary embodiments such as the one illustrated in FIG. 1, the low temperature storage (C) may be kept at a low temperature by employing a low temperature regenerator (F). In exemplary embodiments, the low temperature regenerator (F) may comprise a thermoelectric generator ($A^2$). The thermoelectric generator ($A^2$) operates in a substantially similar manner to the thermoelectric generator (A) except it uses the low temperature storage (C) on one side and an ambient temperature (I) on the other side to create a temperature difference across the thermoelectric generator ($A^2$). The thermal difference across thermoelectric generator ($A^2$) creates an electrical output identified by direct current (f). The electrical output of thermoelectric generator ($A^2$) may be used to power chiller (G) which may be used to keep the low temperature storage (C) at a low temperature.

In exemplary embodiments, the surfaces of the high temperature storage (B) and low temperature storage (C) may be insulated with insulation (H) to help conserve the thermal energy stored in the materials.

In exemplary embodiments, the phase change material may be any acceptable material that achieves and maintains the desired temperature. Most phase change materials are chemical formulations derived from petroleum products, salts, or water. These types of phase change materials are limited in temperature range options, containment methods, thermal cycles and latent heat capacities.

A phase change material is a material that uses phase changes (e.g., solidify, liquify, evaporate or condense) to absorb or release large amounts of latent heat at relatively constant temperature. Phase change materials leverage the natural property of latent heat to help maintain products temperature for extended periods of time. In exemplary embodiments, the phase change material may be manufactured from renewable resources such as natural vegetable based phase change materials. For example, in exemplary embodiments, the phase change materials may be a type manufactured by Entropy Solutions and sold under the name PureTemp.

Phase change materials can be used in numerous applications so a variety of containment methods may be employed—e.g., microencapsulation (e.g., 10 to 1000 microns, 80-85% core utilization)(e.g., 25, 50, 100, 200, 500, 700, 1000 microns etc.), macro encapsulation (e.g., 1000+ microns, 80-85% core utilization) (e.g., 1000, 1500, 2000, 2500, 300, 4000, 5000+ microns etc.), flexible films, metals, rigid panels, spheres and more. As would be understood by those of ordinary skill in the art, the proper containment option depends on numerous factors.

In exemplary embodiments, the temperature difference between the hot and cold phase change materials may be anywhere from a fraction of a degree to several hundred degrees depending on the power requirements. In exemplary embodiments the phase change material may be capable of producing 1 watt of power with e.g., 5 grams of phase change material or about 3.5 kilowatts with 9 kilograms of material. Dimensionally, in exemplary embodiments, the system may be the size of a cell phone battery (e.g., 22 mm×60 mm×5.6 mm for 1 watt) (e.g., 0.7, 0.8, 0.9, 1, 1.1, 1.2, 1.3, 1.4, 1.5, 1.6, etc.) or as larger (e.g., 21 cm×21 cm×21 cm for about 3.5 kilowatts) (e.g., 3, 3.1, 3.2, 3.3, 3.4, 3.5, 3.6, 3.7, 3.8, 3.9, 4 kilowatts).

In exemplary embodiments, multiple thermoelectric generators may be utilized to increase the amount of energy that is being produced. For example, between 1 and 10 (e.g., 1, 2, 3, 4, 5, 6, 7, 8, 9, 10, 2-4, 3-5, 4-6, etc.) generators may be used in a cell phone whereas the larger 3.5 kilowatt device may use 300-1000 (e.g., 300, 400, 500, 600, 200-400, 300-500, 400-600, etc) generators.

Figure 2:
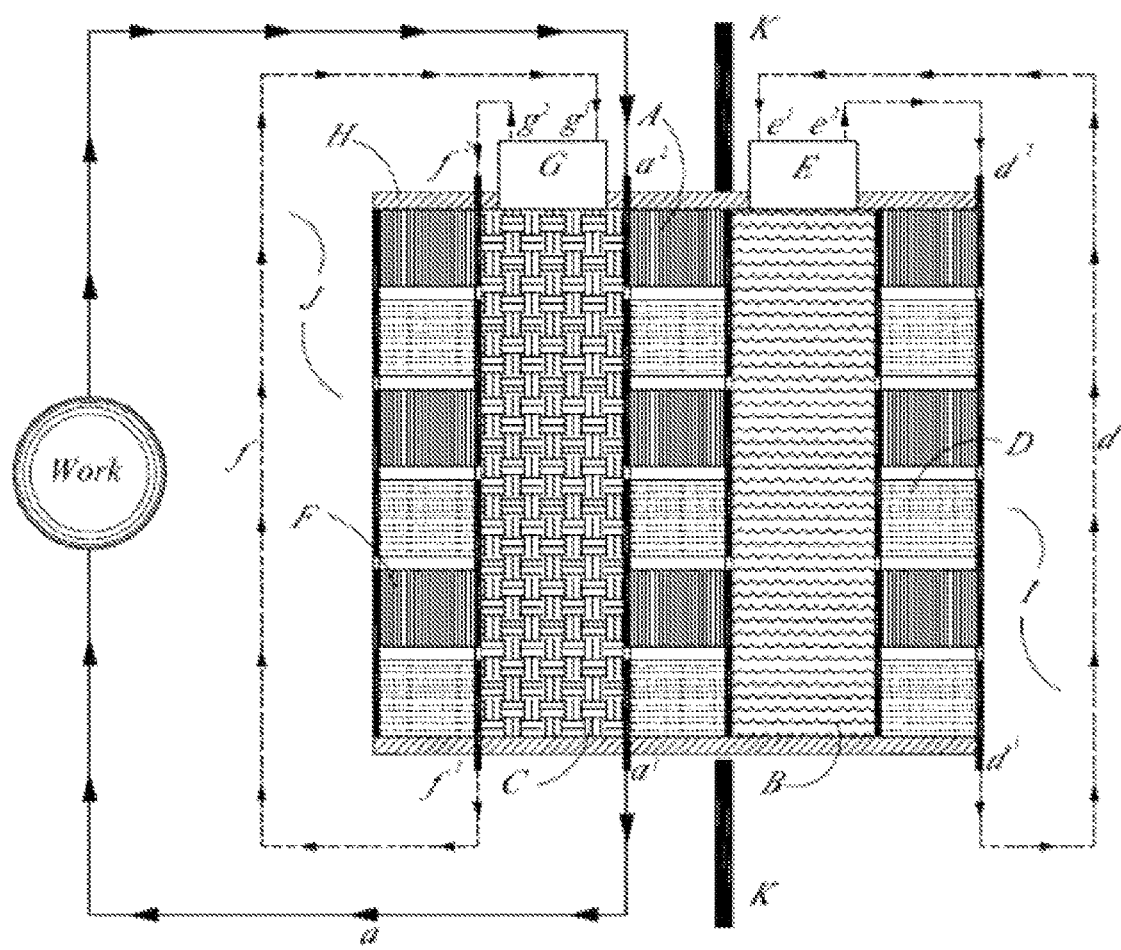
FIG. 2 is a schematic drawing of another exemplary embodiment of a thermoelectric energy generation system.

FIG. 2 is a schematic drawing of another exemplary embodiment of a thermoelectric energy generation system that takes advantage of the energy stored in the ambient. The embodiment in FIG. 2 is similar to the embodiment of FIG. 1 except an insulating barrier (K) is used to maintain two different ambient temperatures, a high side ambient temperature (I) and a low side ambient temperature (J). This arrangement may be beneficial when, for example, the high temperature material (B) is kept at a relatively low temperature. In this case, the high side ambient temperature (I) may be maintained at a lower temperature than the low side ambient temperature (J).

Figure 3:
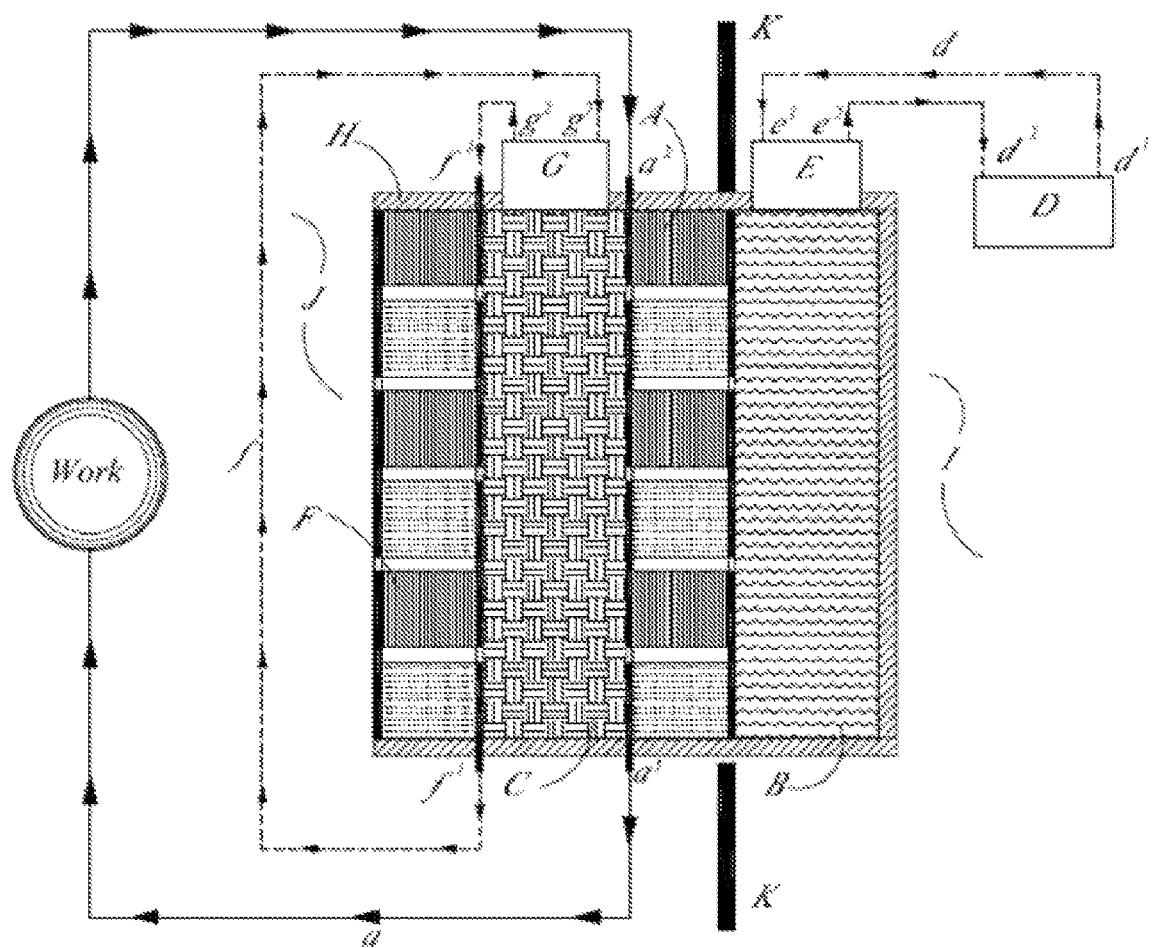
FIG. 3 is a schematic drawing of another exemplary embodiment of a thermoelectric energy generation system.

FIG. 3 is a schematic drawing of another exemplary embodiment of a thermoelectric energy generation system. The embodiment in FIG. 3 is similar to the embodiment of FIG. 2 except, instead of a high temperature regenerator, an alternative power source (D) is provided for the heater (E). The power source (D) may be any conventional power source such as a battery, an engine, etc.

Figure 4:
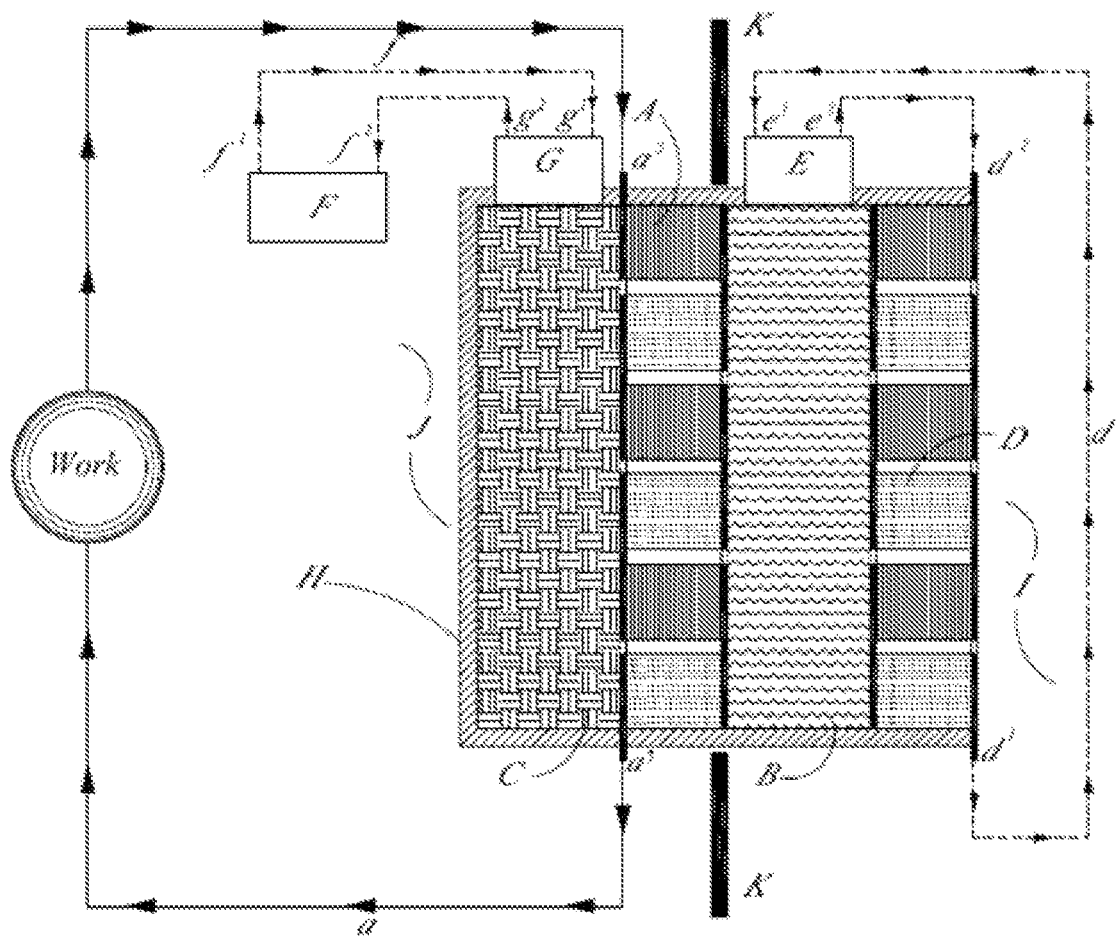
FIG. 4 is a schematic drawing of another exemplary embodiment of a thermoelectric energy generation system.

FIG. 4 is a schematic drawing of another exemplary embodiment of a thermoelectric energy generation system. The embodiment in FIG. 4 is similar to the embodiment of FIG. 2 except, instead of a low temperature regenerator, an alternative power source (F) is provided for the chiller (G). Again, the power source (F) may be any conventional power source such as a battery, an engine, etc.

Figure 5:
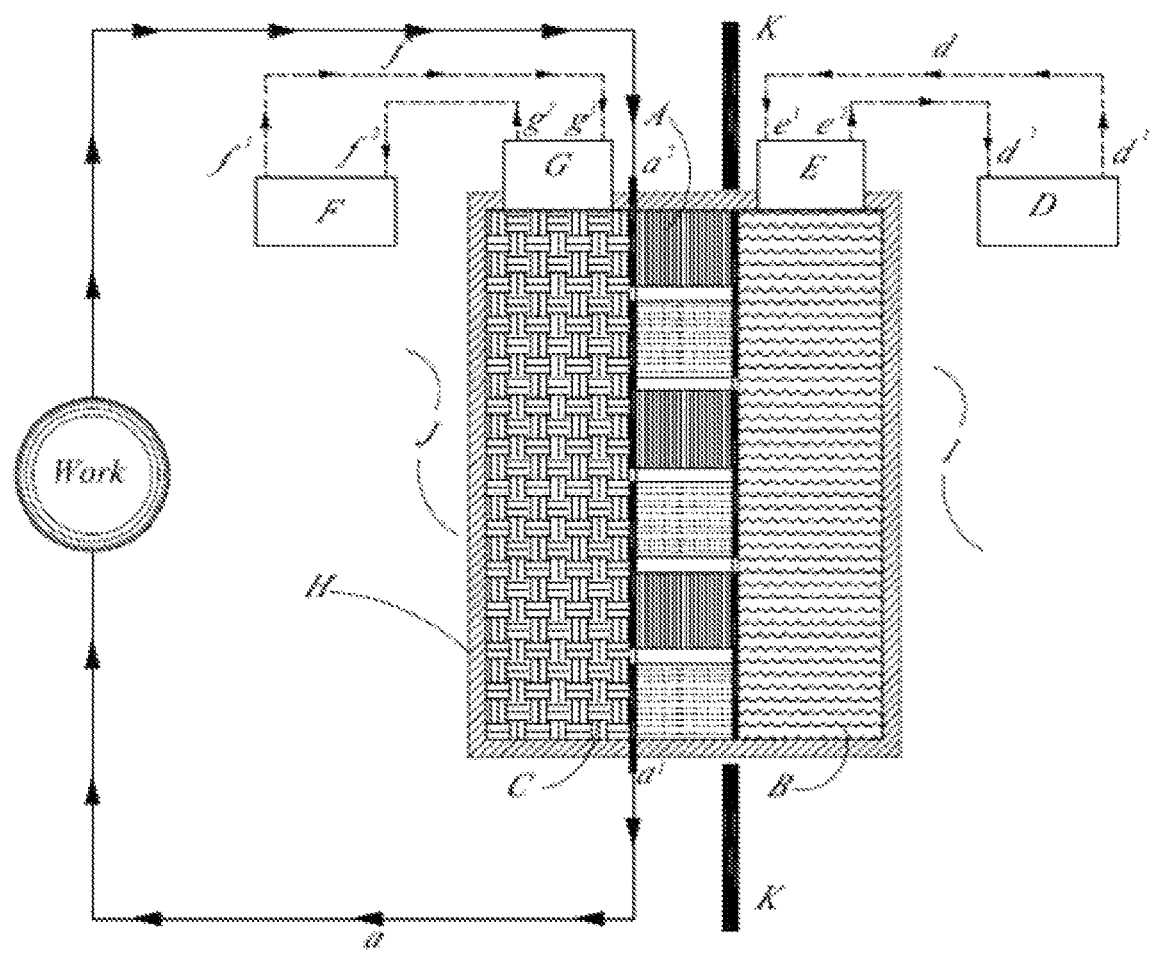
FIG. 5 is a schematic drawing of another exemplary embodiment of a thermoelectric energy generation system.

FIG. 5 is a schematic drawing of another exemplary embodiment of a thermoelectric energy generation system. The embodiment in FIG. 5 is similar to the embodiment of FIG. 2 except, instead of a high temperature regenerator and low temperature regenerator, both are replaced with an alternative power source (D, F) for the heater (E) and chiller (G). The power sources (D, F) may be any conventional power source such as a battery, an engine, solar, geothermal, electromagnetic, etc. This embodiment may be beneficial when both energy sources have an available man made wasted thermal energy source. In this case, it may no be necessary to include regeneration capabilities in the system.

Figure 6:
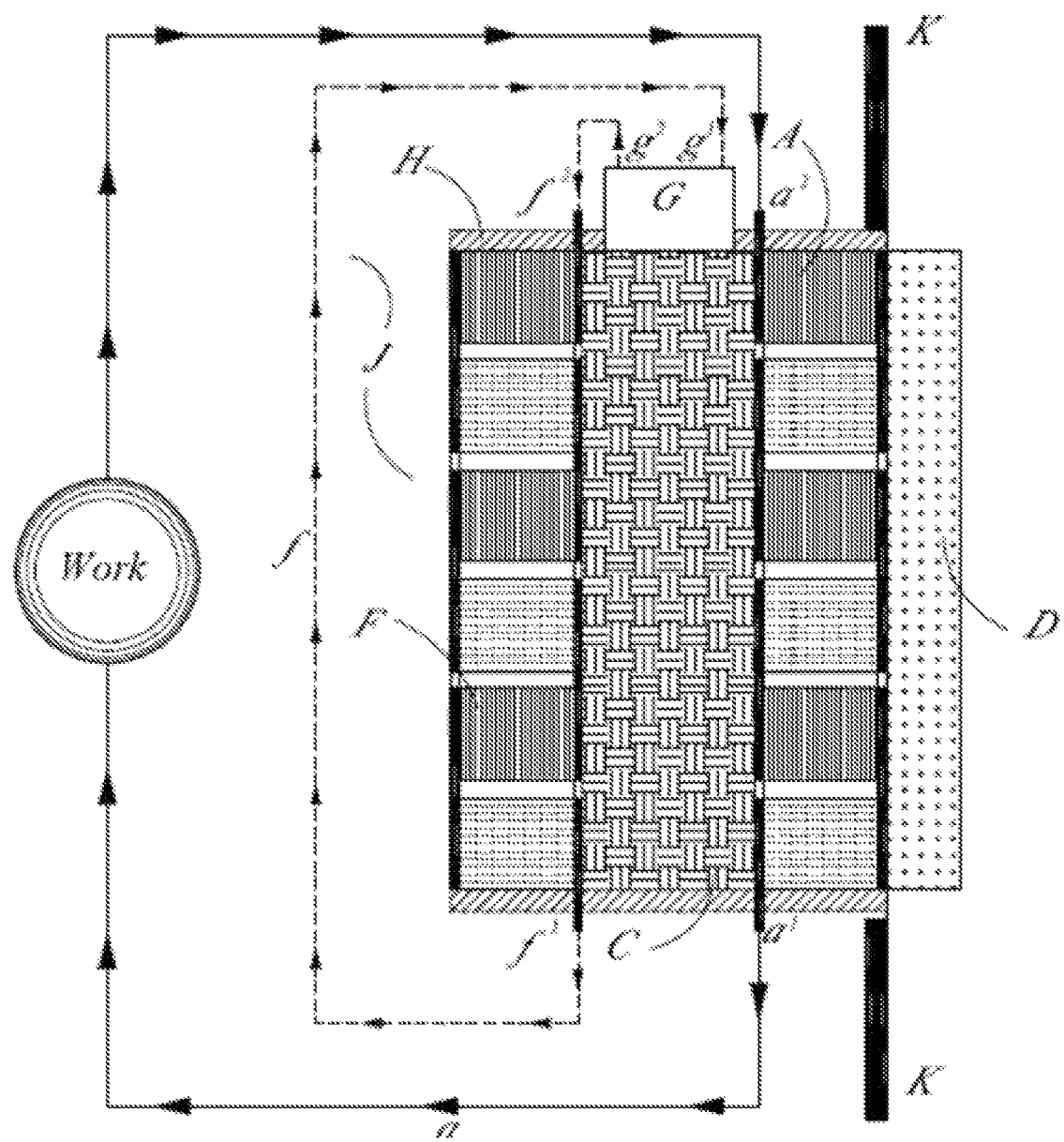
FIG. 6 is a schematic drawing of another exemplary embodiment of a thermoelectric energy generation system.

FIG. 6 is a schematic drawing of another exemplary embodiment of a thermoelectric energy generation system. In FIG. 6, the high temperature source is replaced with an alternative high temperature source (D). In exemplary embodiments, the high temperature source may be e.g., heat from nuclear fuel rods, lava from an active volcano, heat from a furnace, body temperature, etc.

Figure 7:
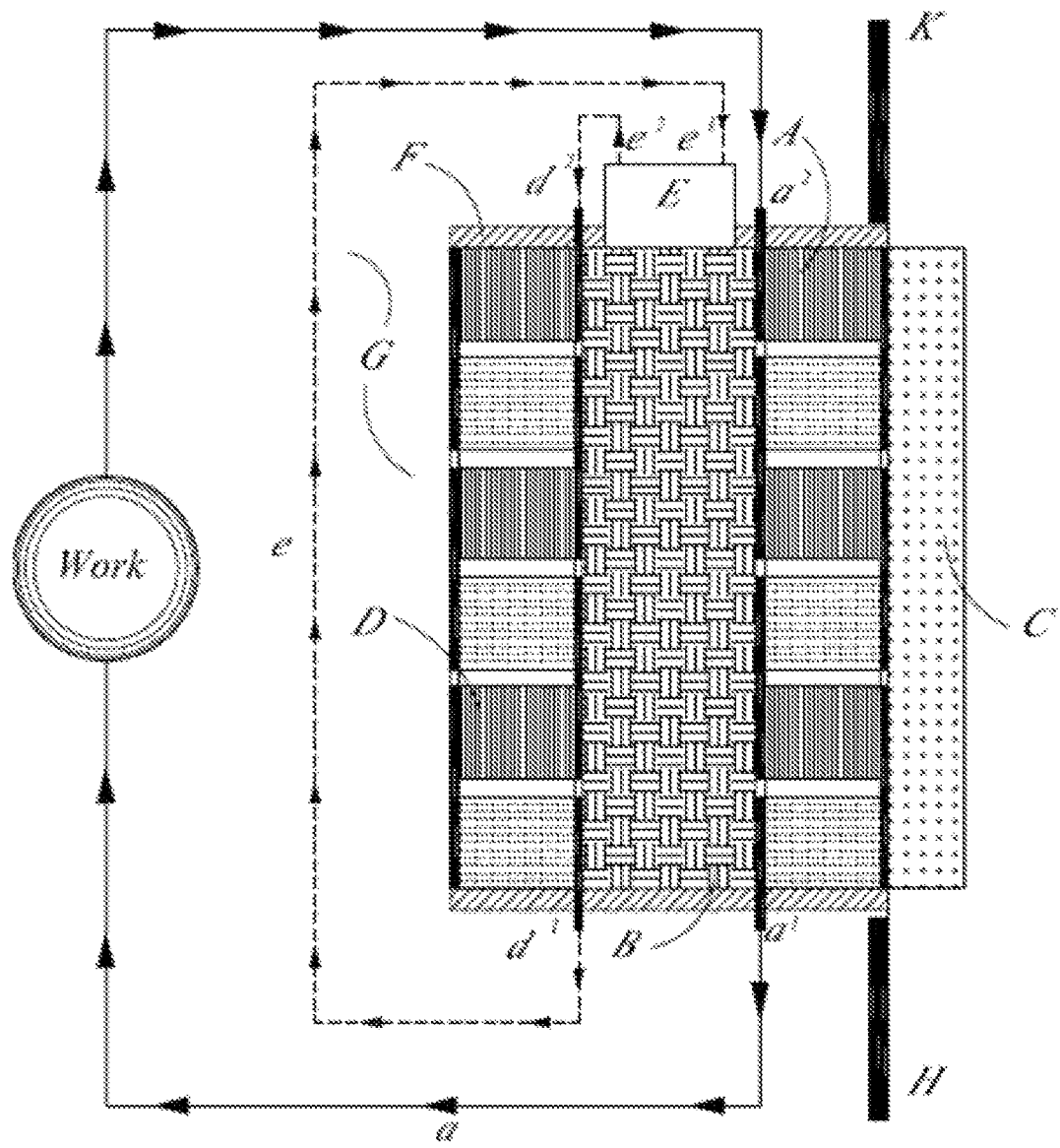
FIG. 7 is a schematic drawing of another exemplary embodiment of a thermoelectric energy generation system.

FIG. 7 is a schematic drawing of another exemplary embodiment of a thermoelectric energy generation system. In FIG. 7, the low temperature source is replaced with an alternative low temperature source (C).

Figure 8:
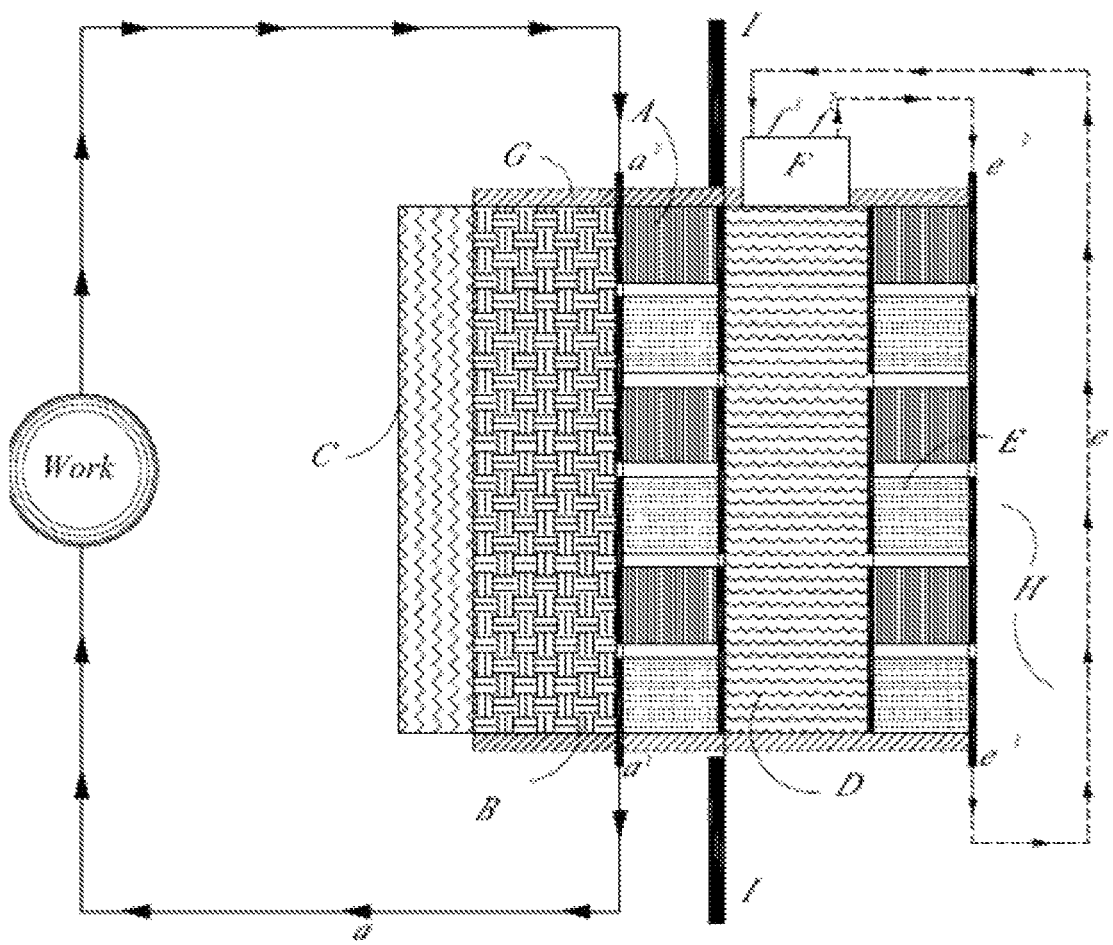
FIG. 8 is a schematic drawing of another exemplary embodiment of a thermoelectric energy generation system.

FIG. 8 is a schematic drawing of another exemplary embodiment of a thermoelectric energy generation system. In FIG. 8, the high temperature material is kept at a high temperature using an alternative heat source (C).

Figure 9:
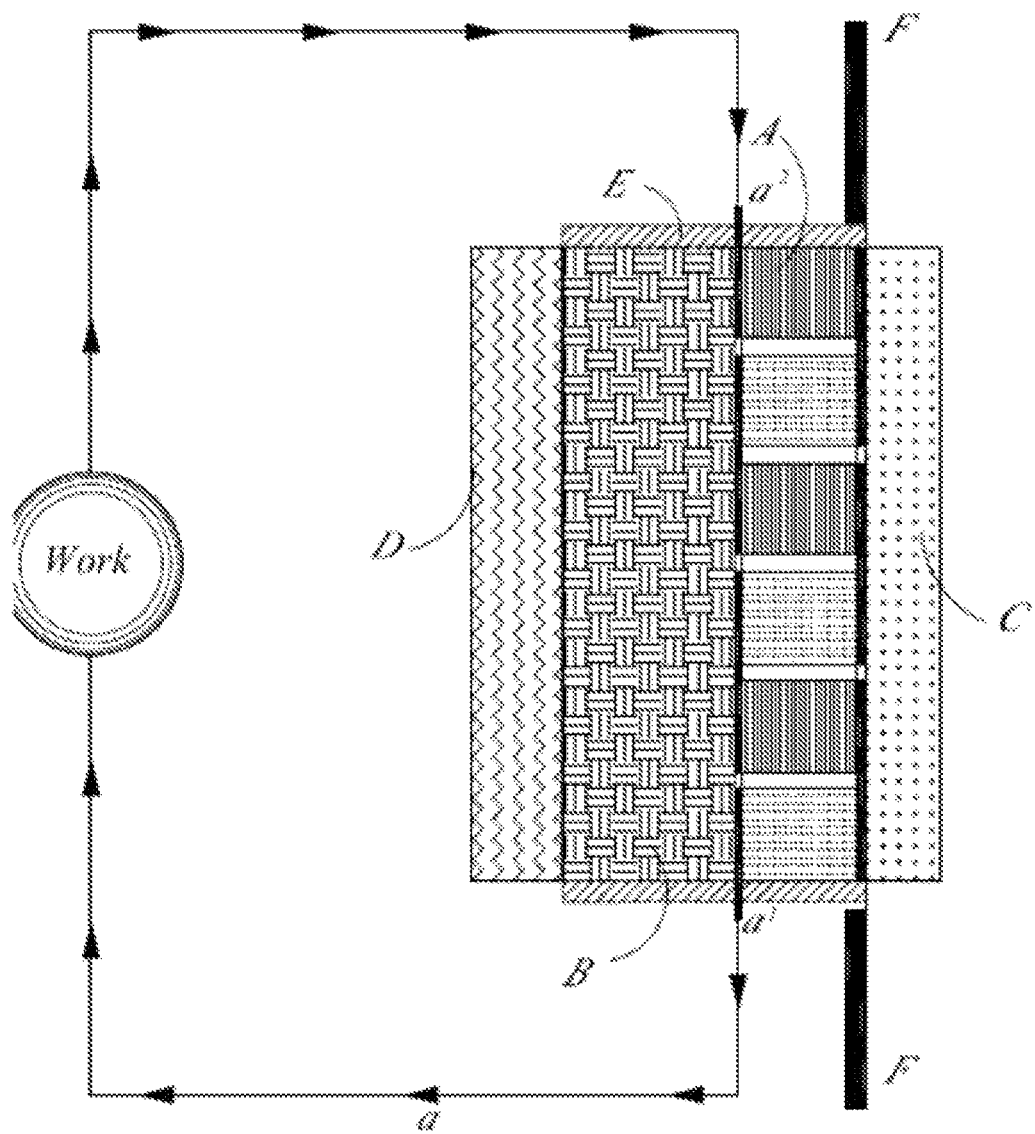
FIG. 9 is a schematic drawing of another exemplary embodiment of a thermoelectric energy generation system.

FIG. 9 is a schematic drawing of another exemplary embodiment of a thermoelectric energy generation system. In FIG. 9, both the high temperature source and low temperature sources have been replaced with alternative high temperature source (C) and alternative low temperature source (D). As described above, various alternative sources are available.

Figure 10:
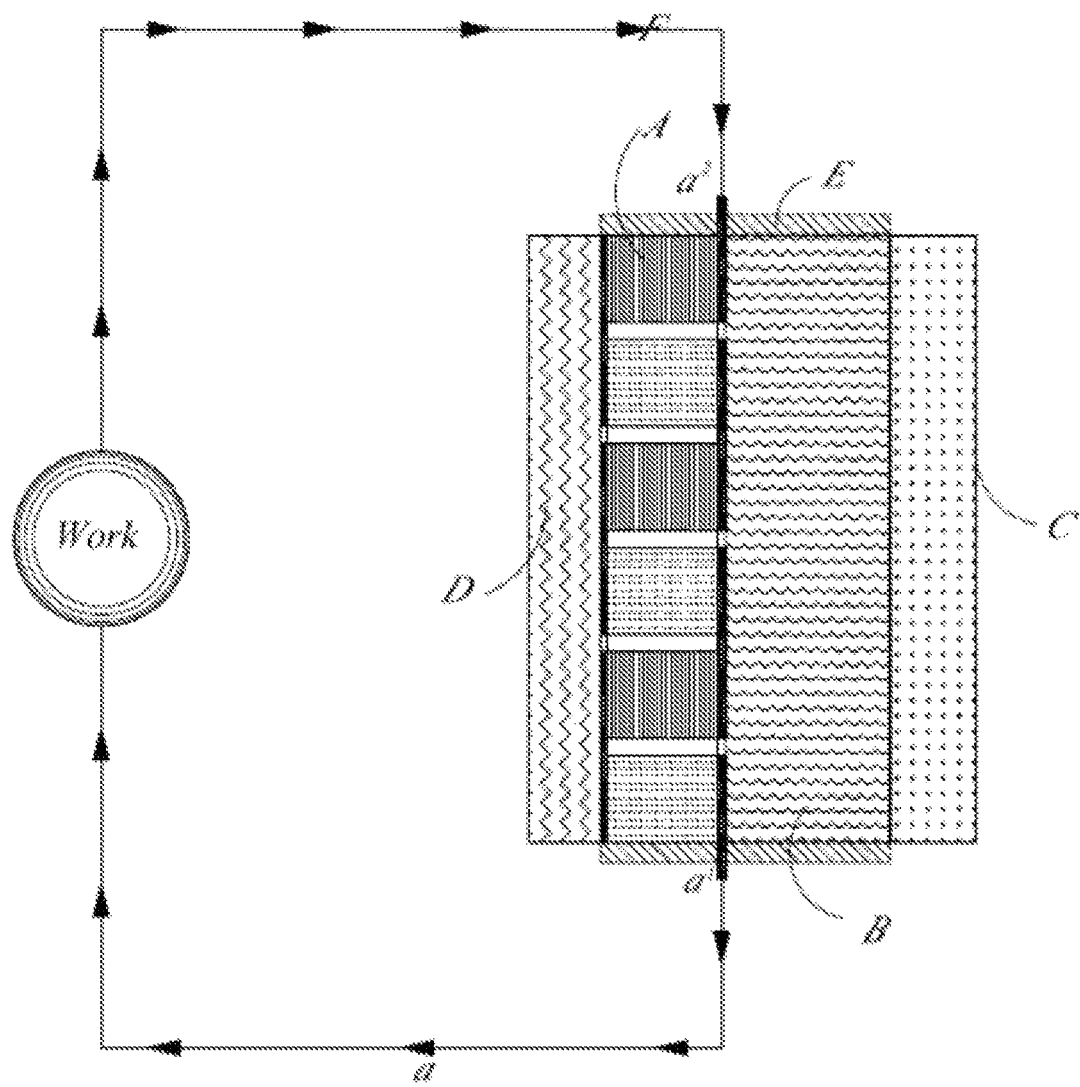
FIG. 10 is a schematic drawing of another exemplary embodiment of a thermoelectric energy generation system.

FIG. 10 is a schematic drawing of another exemplary embodiment of a thermoelectric energy generation system.

FIGS. 8-10, are similar to the embodiments of FIGS. 6 and 7 except a phase change material is also present in case the alternative sources are intermittent or fluctuating in temperature.

Figure 11:
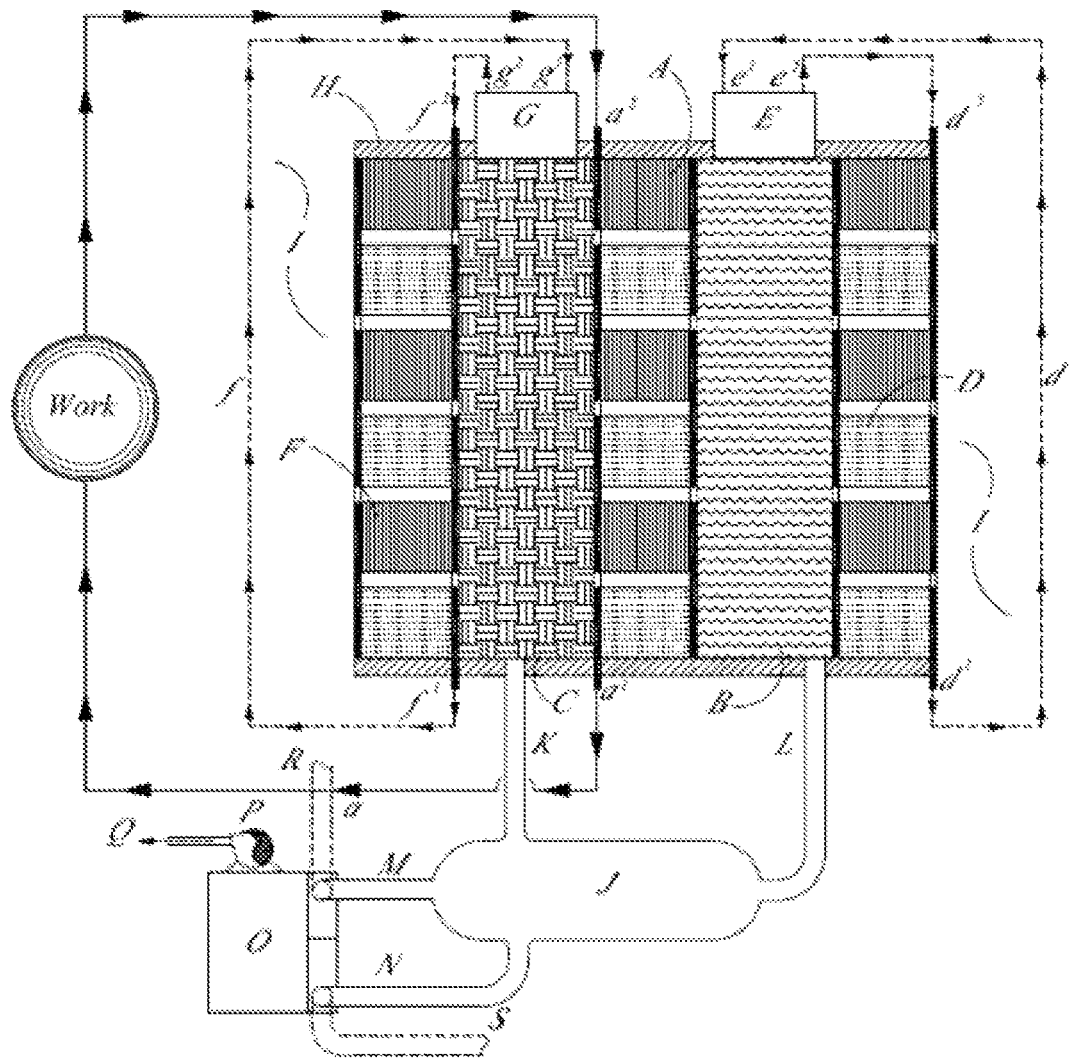
FIG. 11 is a schematic drawing of another exemplary embodiment of a thermoelectric energy generation system.

FIG. 11 is a schematic drawing of another exemplary embodiment of a thermoelectric generator, heating and cooling system. FIG. 11 is similar to the embodiment illustrated in FIG. 1 but also includes a heat exchanger (J) to provide heating and cooling on demand. In this exemplary embodiment, the high temperature inlet (L) and low temperature inlet (K) provide used liquid or vapor that is heated or cooled by the high temperature storage (B) or the low temperature storage (C) to the heat exchanger (J) which cools the liquid or vapor received from the low temperature inlet (K) or further warms the liquid or vapor received from the high temperature inlet (L). The liquid or vapor then exits the heat exchanger through the high temperature outlet (M), or the low temperature outlet (N), into a plenum or tank (O) where it is distributed to desired locations via pipe or duct, by traditional methods using pumps or fans (P). It releases it's thermal energy into the atmosphere to be heated or cooled and then is returned to the high temperature storage (B) or the low temperature storage (C) via the high temperature return (R) or low temperature return (S), the plenum or tank (O) and the heat exchanger (J). In this embodiment the electrical energy from the thermoelectric generator (A) may be used to generate electrical power for other devices.

Figure 12:
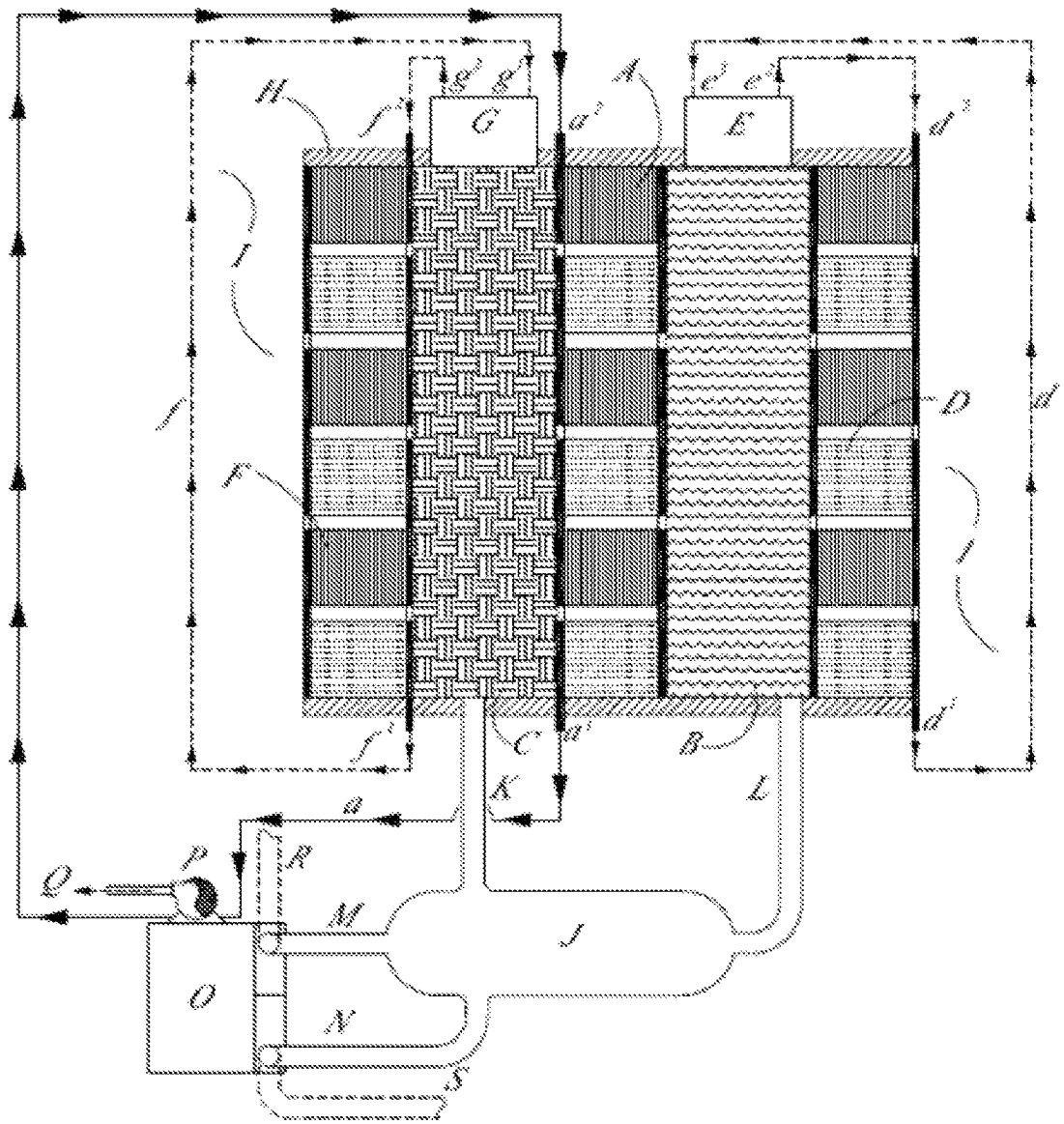
FIG. 12 is a schematic drawing of another exemplary embodiment of a thermoelectric energy generation system.

FIG. 12 is a schematic drawing of another exemplary embodiment of a thermoelectric energy generation system. FIG. 12 is similar to the embodiment illustrated in FIG. 11 but may not power an ancillary devices except for the pumps or fans (P)., from the thermoelectric generator (A).

Figure 13:
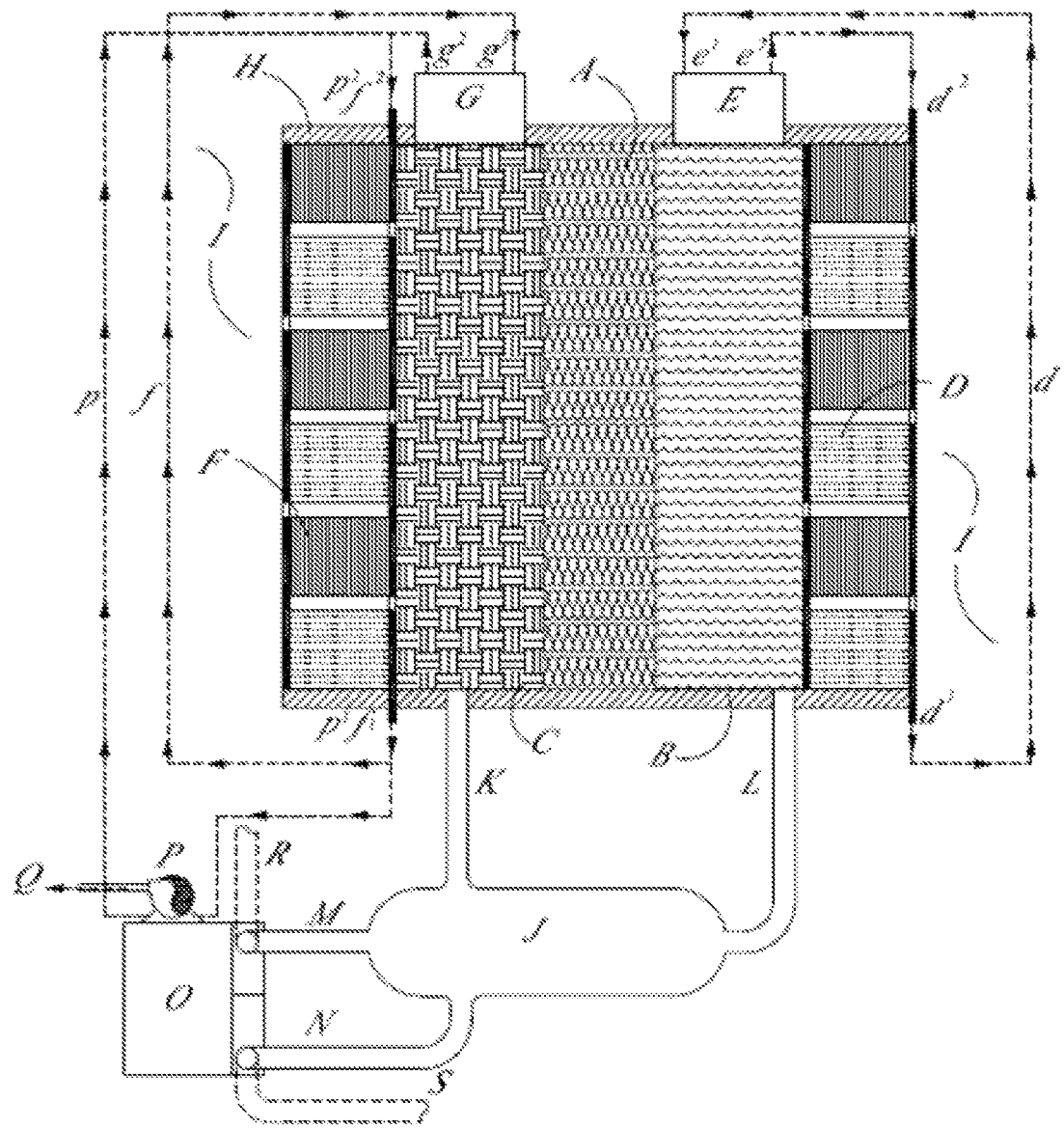
FIG. 13 is a schematic drawing of another exemplary embodiment of a thermoelectric energy generation system.

FIG. 13 is a schematic drawing of another exemplary embodiment of a thermoelectric generating, heating and cooling system. In this embodiment, the thermoelectric generator between the ambient and cold material is making power to run the fan.

Although many of the exemplary embodiments described above are single modifications to the exemplary embodiment of FIG. 2, it should be readily understood by a person of ordinary skill in the art that the same or similar variations could be made to, for example, FIG. 1. Additionally, the various exemplary modifications could be made in combination with each other to create additional exemplary embodiments.

Figure 14:
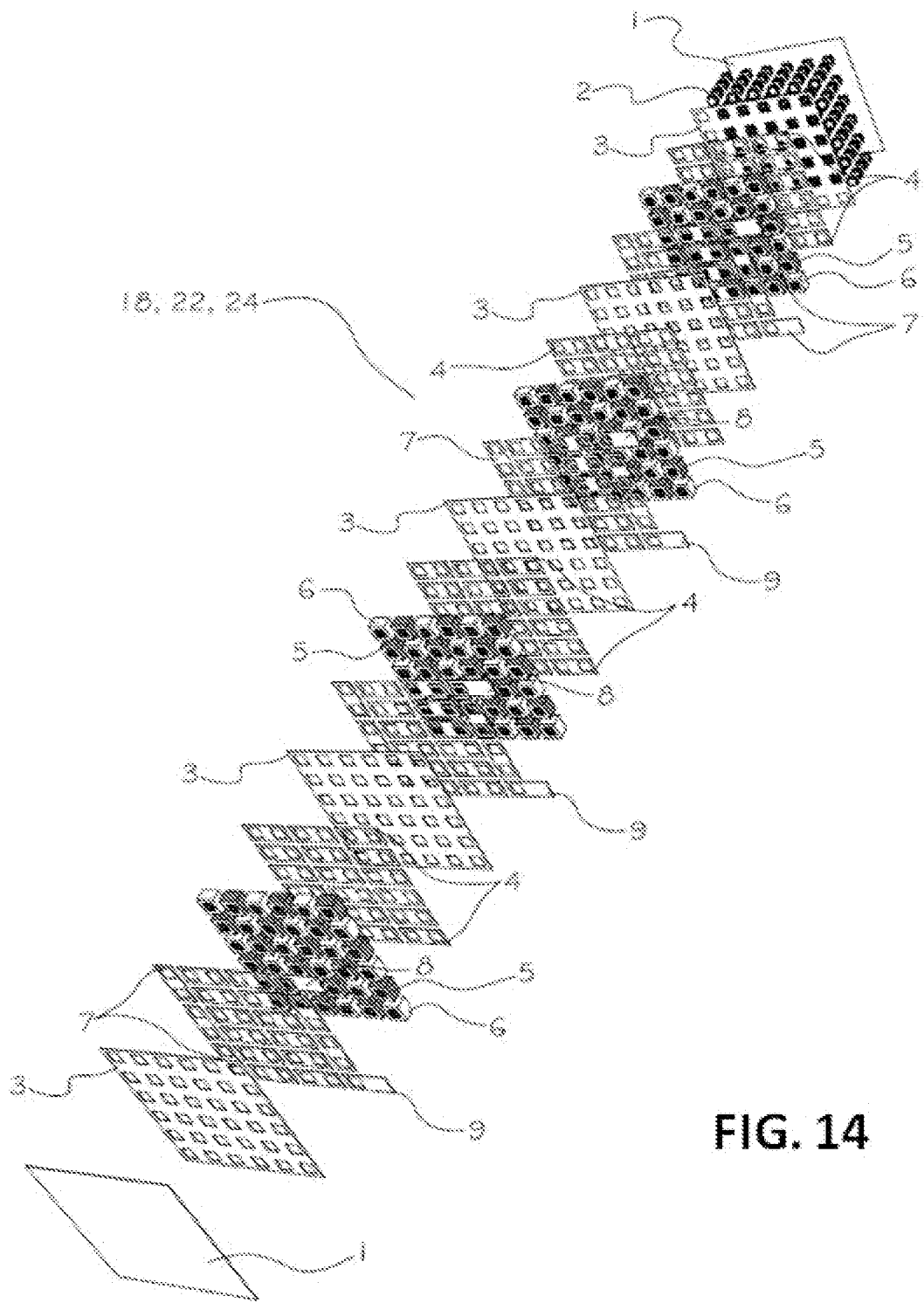
FIG. 14 is an exploded view of an exemplary embodiment of a thermoelectric device that may be utilized in exemplary thermoelectric energy generation systems.

FIG. 14 is an exploded view of an exemplary embodiment of a thermoelectric device that may be utilized in exemplary thermoelectric energy generation systems. In exemplary embodiments, a more efficient thermoelectric device may be used instead of a generic off the shelf device.

Figure 15:
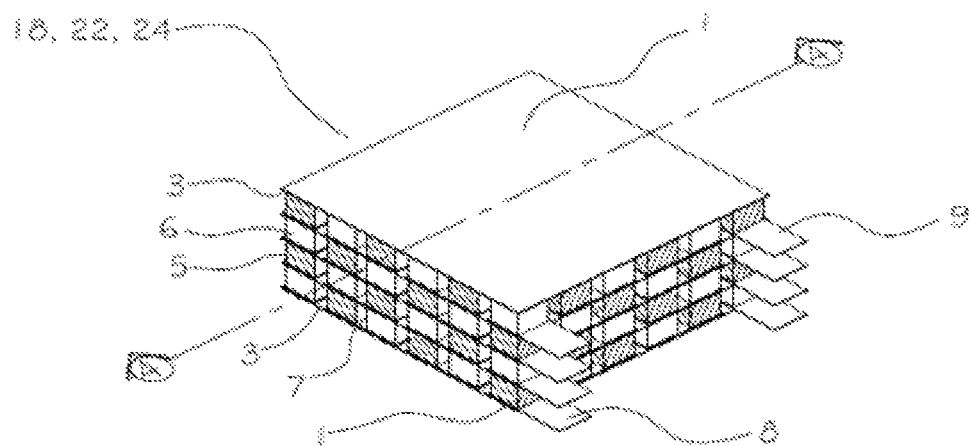
FIG. 15 is an isometric view of an exemplary embodiment of a thermoelectric device that may be utilized in exemplary thermoelectric energy generation systems.
Figure 16:
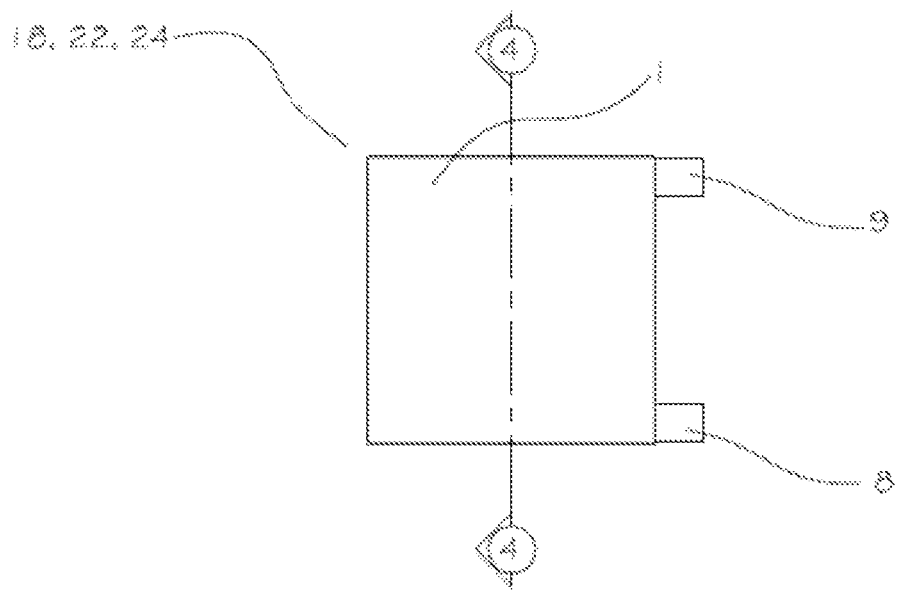
FIG. 16 is a plan view of an exemplary embodiment of a thermoelectric device that may be utilized in exemplary thermoelectric energy generation systems.
Figure 17:
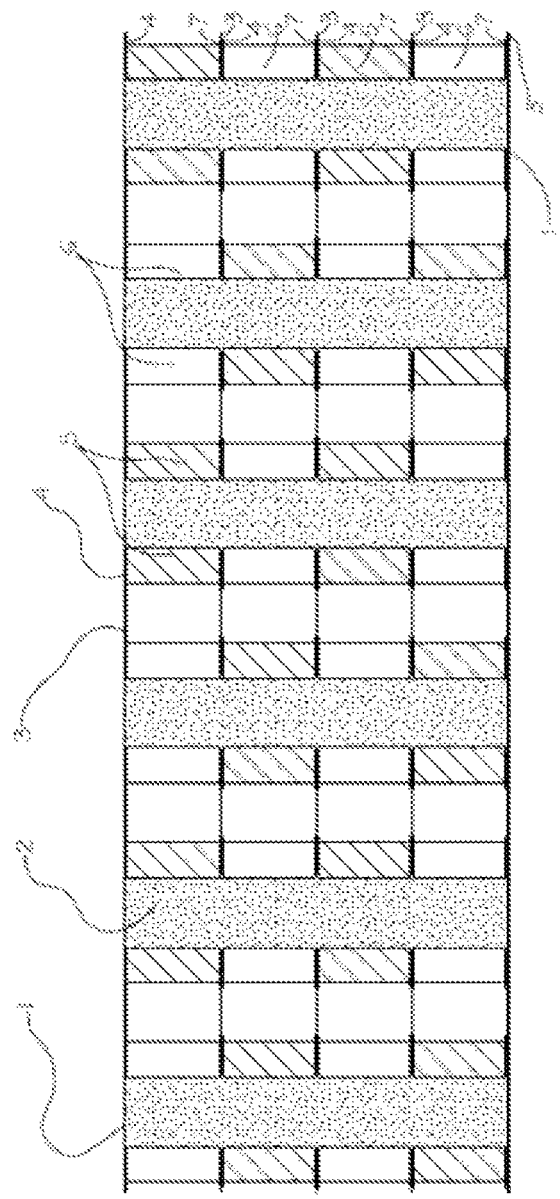
FIG. 17 is a cross sectional view of an exemplary embodiment of a thermoelectric device that may be utilized in exemplary thermoelectric energy generation systems.
Figure 18:
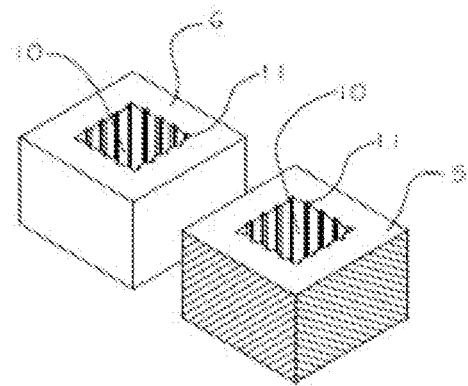
FIG. 18 is an isometric view of an exemplary embodiment of semiconductor posts that may be used in exemplary embodiments of thermoelectric devices.
Figure 19:
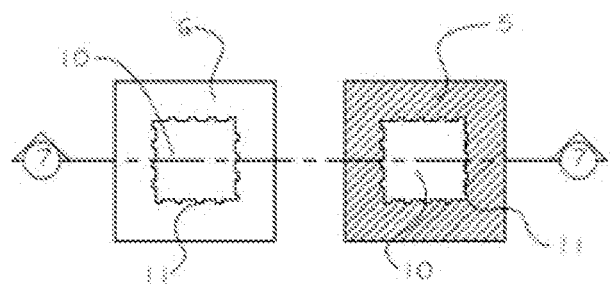
FIG. 19 is a plan view of an exemplary embodiment of semiconductor posts that may be used in exemplary embodiments of thermoelectric devices.
Figure 20:
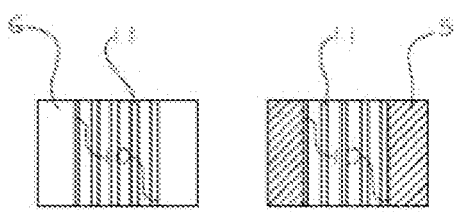
FIG. 20 is a cross sectional view of an exemplary embodiment of semiconductor posts that may be used in exemplary embodiments of thermoelectric devices.

Additional details of the exemplary embodiment described in FIG. 14 can be found in FIGS. 15-20. FIG. 15 is an isometric view of an exemplary embodiment of a thermoelectric device that may be utilized in exemplary thermoelectric energy generation systems. FIG. 16 is a plan view of an exemplary embodiment of a thermoelectric device that may be utilized in exemplary thermoelectric energy generation systems. FIG. 17 is a cross sectional view of an exemplary embodiment of a thermoelectric device that may be utilized in exemplary thermoelectric energy generation systems. FIG. 18 is an isometric view of an exemplary embodiment of semiconductor posts that may be used in exemplary embodiments of thermoelectric devices. FIG. 19 is a plan view of an exemplary embodiment of semiconductor posts that may be used in exemplary embodiments of thermoelectric devices. FIG. 20 is a cross sectional view of an exemplary embodiment of semiconductor posts that may be used in exemplary embodiments of thermoelectric devices;

The thermoelectric device 18, 22, 24 comprises vacuum seal foils 1 that seal both ends of the module to create evacuated, or sustainably evacuated, chambers. The chambers may contain an amount of heat pipe working fluid 2 when the vacuum seal foils 1 are vacuum sealed onto the two outermost thermally conductive thermoplastic elastomer electrical insulating skins 3 that have cutouts to match chambers is attached, using thermally conductive but electrically insulating epoxy, electrical conductor layer 4 and electrical input/output (I/O) layer 7 which are slightly smaller than the voided areas 10 that have wicking grooves 11, to allow for universal orientation of module, in semiconductor posts 5, 6 that are attached to, using thermal and electrically conductive epoxy, the electrical conductor layers 4 and electrical input/output layers 7. By effectively adding an internal heat pipe thru the semiconductor posts, various benefits may be realized. For example, in exemplary embodiments, less mass in the posts leads to less thermal resistivity which adds efficiency; holes in the posts add surface area allowing more electrons to flow; and/or heat pipe latent energy may reduce the thermal resistivity of the posts which adds efficiency.

In exemplary embodiments, individual semiconductor posts 5, 6 may be arranged in series electrically and in parallel thermally, beginning with the top or "hot" side layer. The series begins with a layer commencing with a positive electrical conductor I/O tab 8 on the right bottom of the layer, when viewed from the top, connecting to a semiconductor n-type post 5, alternating between semiconductor post types 5, 6 until ending with a semiconductor p-type post: 6 that is connected to a negative electrical conductor I/O tab 9 on the bottom left, when viewed from the top. The I/O tab 9 may be connected to the next layer's positive electrical conductor I/O tab 8 on the bottom left of this layer, when viewed from the top, that connects to a semiconductor n-type post 5, alternating between semiconductor post types 6, 5 until ending with a semiconductor post: p-type 6 that is connected to a negative electrical conductor I/O tab 9 on the bottom right of that layer. This structure may continue, alternating layer by layer, until a desired number of layers is achieved. In exemplary embodiments, the bottom most layer ends with a semiconductor p-type post 6 that is connected to a negative electrical conductor I/O tab 9 on the bottom right of the stack. The final electrical input/output (I/O) layer 7 may be attached, using e.g., thermal and electrically conductive epoxy, to a final, bottom or "cold" side, thermally conductive thermoplastic elastomer electrical insulating skin 3 that is sealed using vacuum seal foil 1.

In exemplary embodiments, these exemplary modules may be used in the systems in a number of different manners. For example, the thermoelectric device may be used as an energy converter, in configurations such as (i) a thermoelectric generator module stack 18, when a high thermal energy is applied to the top side and a low thermal energy is applied to the bottom side a positive polarity output electrical flow 26 is achieved, (ii) as a thermoelectric heater module stack 22, when a positive polarity input electrical flow from harvest source 23 is applied and (iii), as a thermoelectric chiller module stack 24, when a negative polarity input electrical flow from harvest source 25 is applied.

Figure 21:
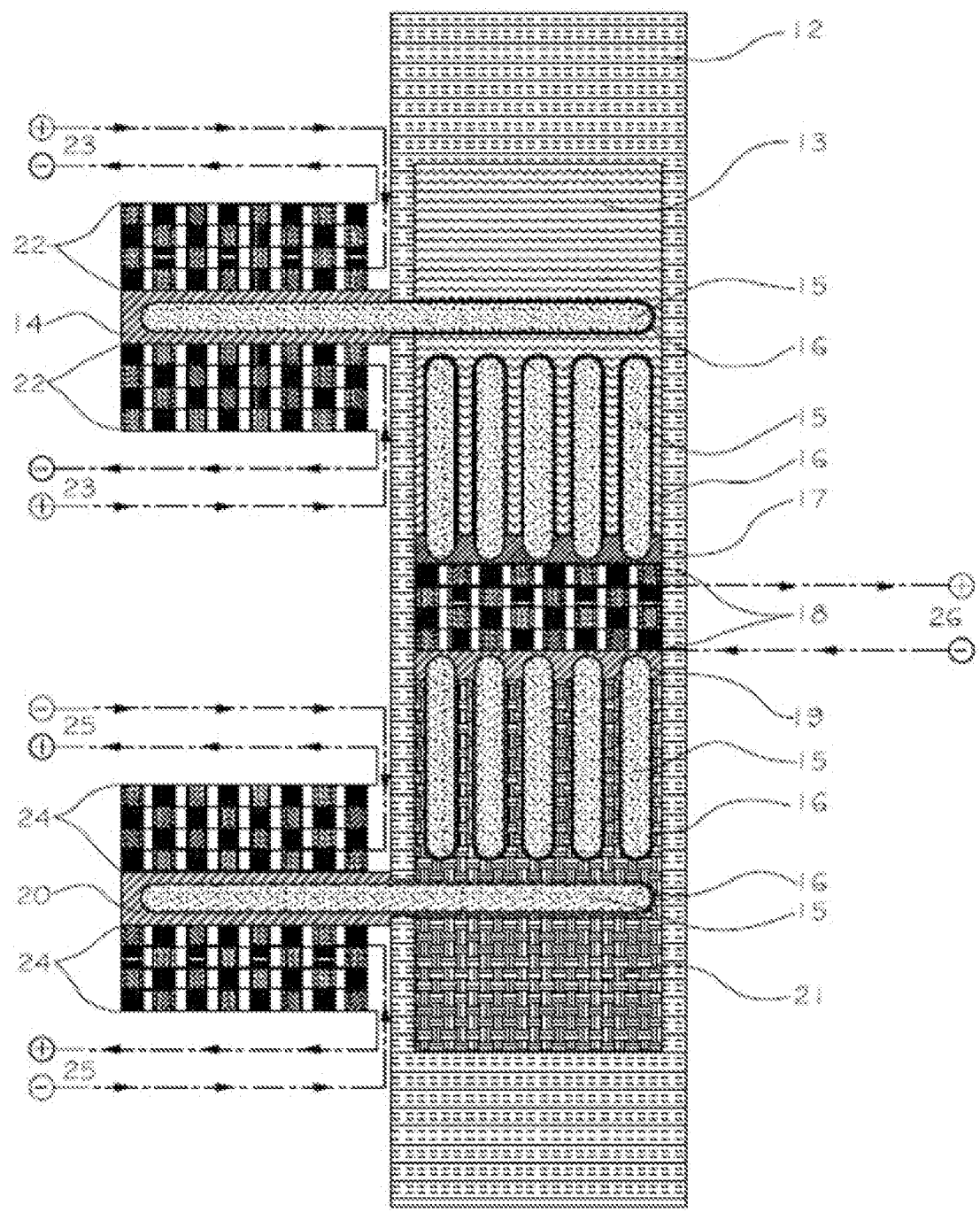
FIG. 21 is a schematic drawing of another exemplary embodiment of a thermoelectric energy generation system.

FIG. 21 is a schematic drawing of another exemplary embodiment of a thermoelectric energy generation system. The exemplary embodiment of FIG. 21 uses a thermoelectric generator 18 which may, in exemplary embodiments, be of scalable size and number to achieve the desired positive polarity output electrical flow 26. The thermoelectric generator 18 may be attached on the "hot" side, using thermally conductive but electrically insulating epoxy, to the flat and smooth surface of a high temperature output thermally conductive heat pipe casing 17 and may be attached on the "cold" side, using thermally conductive but electrically insulating epoxy, to the flat and smooth surface of a low temperature output thermally conductive heat pipe casing 19. The substantially complete adhesion of these casings, avoiding or substantially reducing micro voids may, in some embodiments, be beneficial to the performance of the energy conversion. Both the high temperature output thermally conductive heat pipe casing 17 and the low temperature output thermally conductive heat pipe casing 19 may extend into a stored thermal energy mass in the shape of hollow tubes each of which may have a sintered layer 16 that acts as an interior wick for the heat pipe working fluid 15. The heat pipes may be designed using well known methods of thermodynamics and may be purchased from a number of sources in the heat transfer industry. The high temperature output thermally conductive heat pipe casing 17 tubes may extend into a latent heat thermal energy mass of high temperature phase change material 13 with a high density energy storage that stores heat within a narrow temperature range and a latent heat of >180 J/g. The low temperature output thermally conductive heat pipe casing 19 tubes may extend into a latent heat thermal energy mass of low temperature phase change material 21 with a high density energy storage that stores heat within a narrow temperature range and a latent heat of >180 J/g. In exemplary embodiments, the phase change material may have any combination of the properties identified in Table 1:

TABLE 1

Phase Change Material Properties

| PEAK MELT TEMPERATURE (° C.) | PEAK MELT TEMPERATURE (° F.) | DENSITY (g/cm$^3$) | DENSITY (lb/ft$^3$) | LATENT HEAT (J/g) | LATENT HEAT (BTU/lb) | SPEC. HEAT (J/g ° C.) SOLID | SPEC. HEAT (J/g ° C.) LIQUID | SPEC. HEAT (BTU/lb ° F.) SOLID | SPEC. HEAT (BTU/lb ° F.) LIQUID |
|---|---|---|---|---|---|---|---|---|---|
| −37 | −35 | 0.88 | 54.6 | 147 | 63 | 1.39 | 1.99 | 0.042 | 0.061 |
| −23.8 | −11 | −92 | 57.4 | 215 | 93 | | | 0.000 | 0.000 |
| −15 | 5 | 1.03 | 64.5 | 265 | 114 | 1.84 | 2.06 | 0.056 | 0.063 |
| −12 | 10 | 0.87 | 54.4 | 168 | 72 | 1.86 | 2.07 | 0.057 | 0.063 |
| −5 | 23 | 0.86 | 53.7 | 180 | 78 | 1.66 | 1.93 | 0.051 | 0.059 |
| 1 | 34 | 1.00 | 62.4 | 275 | 118 | 2.32 | 2.43 | 0.071 | 0.074 |
| 4 | 39 | 0.87 | 54.3 | 195 | 84 | 1.28 | 1.65 | 0.039 | 0.050 |
| 6 | 43 | | | | | | | | |
| 8 | 46 | 0.86 | 53.8 | 180 | 78 | 1.85 | 2.15 | 0.056 | 0.066 |
| 12 | 54 | 0.86 | 53.7 | 185 | 80 | 1.76 | 2.25 | 0.054 | 0.069 |
| 15 | 59 | 0.86 | 53.8 | 165 | 71 | 2.25 | 2.56 | 0.069 | 0.078 |
| 18 | 64 | 0.86 | 53.4 | 189 | 81 | 1.47 | 1.74 | 0.045 | 0.053 |
| 20 | 68 | 0.86 | 53.8 | 190 | 82 | 2.59 | 2.89 | 0.079 | 0.088 |
| 23 | 73 | 0.83 | 51.9 | 203 | 87 | 1.84 | 1.99 | 0.056 | 0.061 |
| 24 | 75 | 0.86 | 53.7 | 189 | 81 | 2.85 | 3.04 | 0.087 | 0.093 |
| 27 | 81 | 0.86 | 53.9 | 200 | 86 | 2.46 | 2.63 | 0.075 | 0.080 |
| 28 | 82 | 0.86 | 53.7 | 205 | 88 | 2.34 | 2.54 | 0.071 | 0.077 |
| 29 | 84 | 0.85 | 53.2 | 189 | 81 | 1.77 | 1.94 | 0.054 | 0.059 |
| 30 | 86 | 0.89 | 55.7 | 163 | 70 | 1.58 | 1.62 | 0.048 | 0.049 |
| 33 | 91 | 0.85 | 52.9 | 185 | 80 | 2.34 | 2.53 | 0.071 | 0.077 |
| 37 | 99 | 0.84 | 52.4 | 222 | 96 | 1.0 | 1.09 | 0.031 | 0.033 |
| 40 | 104 | 0.85 | 53.1 | 198 | 85 | 1.98 | 2.13 | 0.060 | 0.065 |
| 43 | 109 | 0.88 | 55.1 | 180 | 78 | 1.87 | 1.94 | 0.057 | 0.059 |
| 48 | 118 | 0.82 | 51.1 | 245 | 106 | 2.10 | 2.27 | 0.064 | 0.069 |
| 50 | 122 | 0.86 | 53.8 | 200 | 86 | 1.82 | 1.94 | 0.056 | 0.059 |
| 56 | 133 | 0.81 | 50.7 | 237 | 102 | 1.47 | 2.71 | 0.075 | 0.083 |
| 61 | 142 | 0.84 | 52.4 | 199 | 86 | 1.99 | 2.16 | 0.061 | 0.066 |
| 68 | 154 | 0.87 | 54.3 | 198 | 85 | 1.85 | 1.91 | 0.056 | 0.058 |
| 103 | 217 | 1.22 | 76.2 | 157 | 68 | 2.09 | 2.28 | 0.064 | 0.069 |
| 133 | 271 | 1.21 | 75.5 | 230 | 99 | 1.57 | 1.95 | 0.048 | 0.059 |
| 142 | 288 | 1.27 | 79.4 | 180 | 78 | 1.61 | 1.76 | 0.049 | 0.054 |
| 151 | 304 | 1.36 | 84.9 | 182 | 78 | 2.06 | 2.17 | 0.063 | 0.066 |

In exemplary embodiments, the stored energy can be calculated using the following equation;

$$\frac{kW}{h} = \frac{\left(cm^3 * \frac{g}{cm^3}\right) * \frac{J}{g}}{3{,}600{,}000}$$

where stored latent heat energy (kW/h) equals the volume of phase change material (cm³) multiplied by the phase change material density (g/cm³); the sum of which is then multiplied by the phase change material latent heat storage capability (J/g) and then the total (J) is converted into kW/h by dividing by 3,600,000.

Both the high temperature phase change material 13 and/or the low temperature phase change material 21 may have additional heat pipes embedded to ensure their temperature is maintained or substantially maintained.

A high temperature input thermally conductive heat pipe casing 14 with the tube portion embedded into the high temperature phase change material 13 may include a sintered layer 16 designed to wick the heat pipe working fluid 15 and may also include a flat and smooth surface of the same high temperature output thermally conductive heat pipe casing 13. In exemplary embodiments, the heat pipe may extend beyond the insulating casket 12. Similarly, a low temperature input thermally conductive heat pipe casing 20 with the tube portion embedded into the low temperature phase change material 21 may include a sintered layer 16 designed to wick the heat pipe working fluid 15 and a flat and smooth surface of the same low temperature output thermally conductive heat pipe casing 20. In exemplary embodiments, the heat pipe may extend beyond the insulating casket 12 which may aid in conducting the thermal energy from a remote source into the device.

When determining the temperature for both the high temperature phase change material 13 and the low temperature phase change material 21, the most extreme local temperature, hot or cold, that naturally occurs and/or occurs as a secondary waste from a primary action, may be exploited. For example, if installing the system in a factory in the desert with a high average daytime temperature where there are other sources of heat that occur as byproducts of work done at the factory during the day, that heat may be used to maintain and/or increase the high temperature of the high temperature phase change material 13 thereby making it easier to achieve and maintain a large thermal distance.

For example, FIG. 21 is a schematic drawing of another exemplary embodiment of a thermoelectric energy generation system. As shown in FIG. 21, thermoelectric heater module stacks 22 may attached to the high temperature input thermally conductive heat pipe casing 14 using thermally conductive but electrically insulating epoxy, to it's flat and smooth outside surface. The heat may be generated by adding positive polarity input electrical flow from harvest sources 23. Also, thermoelectric chiller module stacks 24 are attached to the low temperature input thermally conductive heat pipe casing 20 using thermally conductive but electrically insulating epoxy, to it's flat and smooth outside surface. The cooling may be generated by adding negative polarity input electrical flow from harvest source 25.

Figure 22:
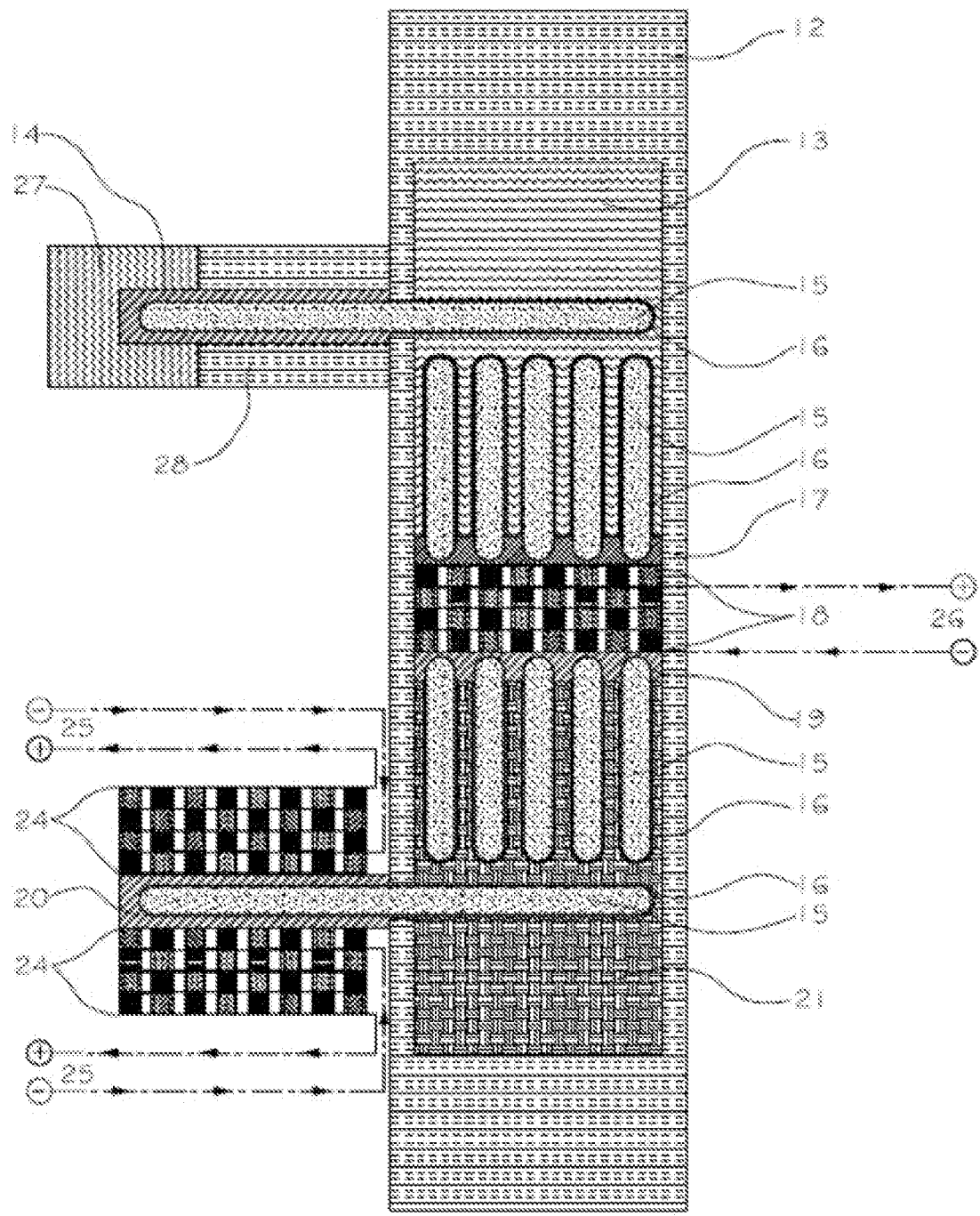
FIG. 22 is a schematic drawing of another exemplary embodiment of a thermoelectric energy generation system.

FIG. 22 is a schematic drawing of another exemplary embodiment of a thermoelectric energy generation system. Referring to FIG. 22, if there is a heat source that can be harvested directly, the thermoelectric heater module stacks 22 referenced in FIG. 21 may be eliminated and the high temperature input thermally conductive heat pipe casing 14 can be directly attached to the waste source of high temperature thermal energy.

Figure 23:
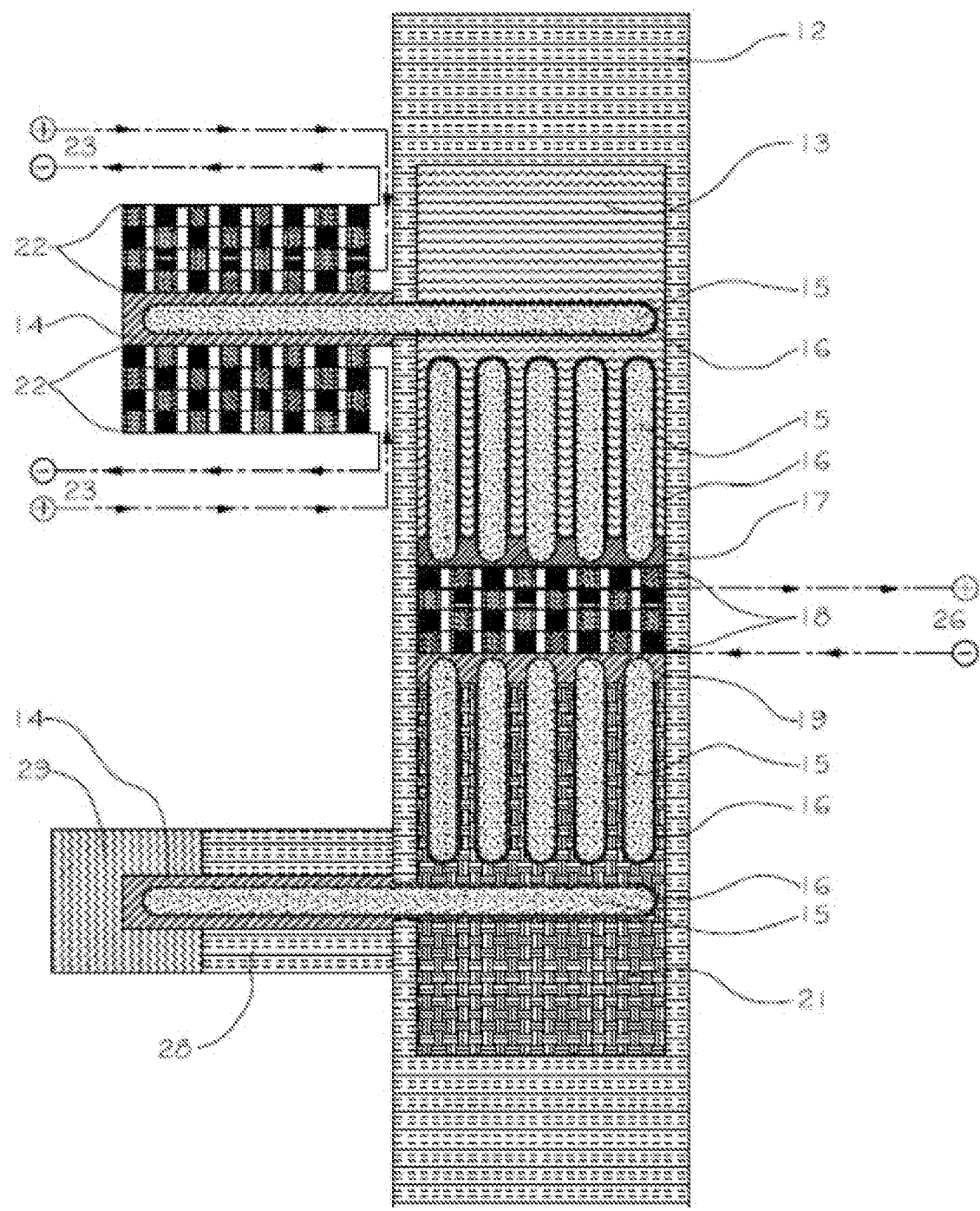
FIG. 23 is a schematic drawing of another exemplary embodiment of a thermoelectric energy generation system.

FIG. 23 is a schematic drawing of another exemplary embodiment of a thermoelectric energy generation system. Referring to FIG. 23, if there is a cold temperature source that can be harvested directly, the thermoelectric chiller module stacks 24 referenced in FIG. 21 can be eliminated and the low temperature input thermally conductive heat pipe casing 20 can be directly attached to the waste source of low temperature thermal energy.

Figure 24:
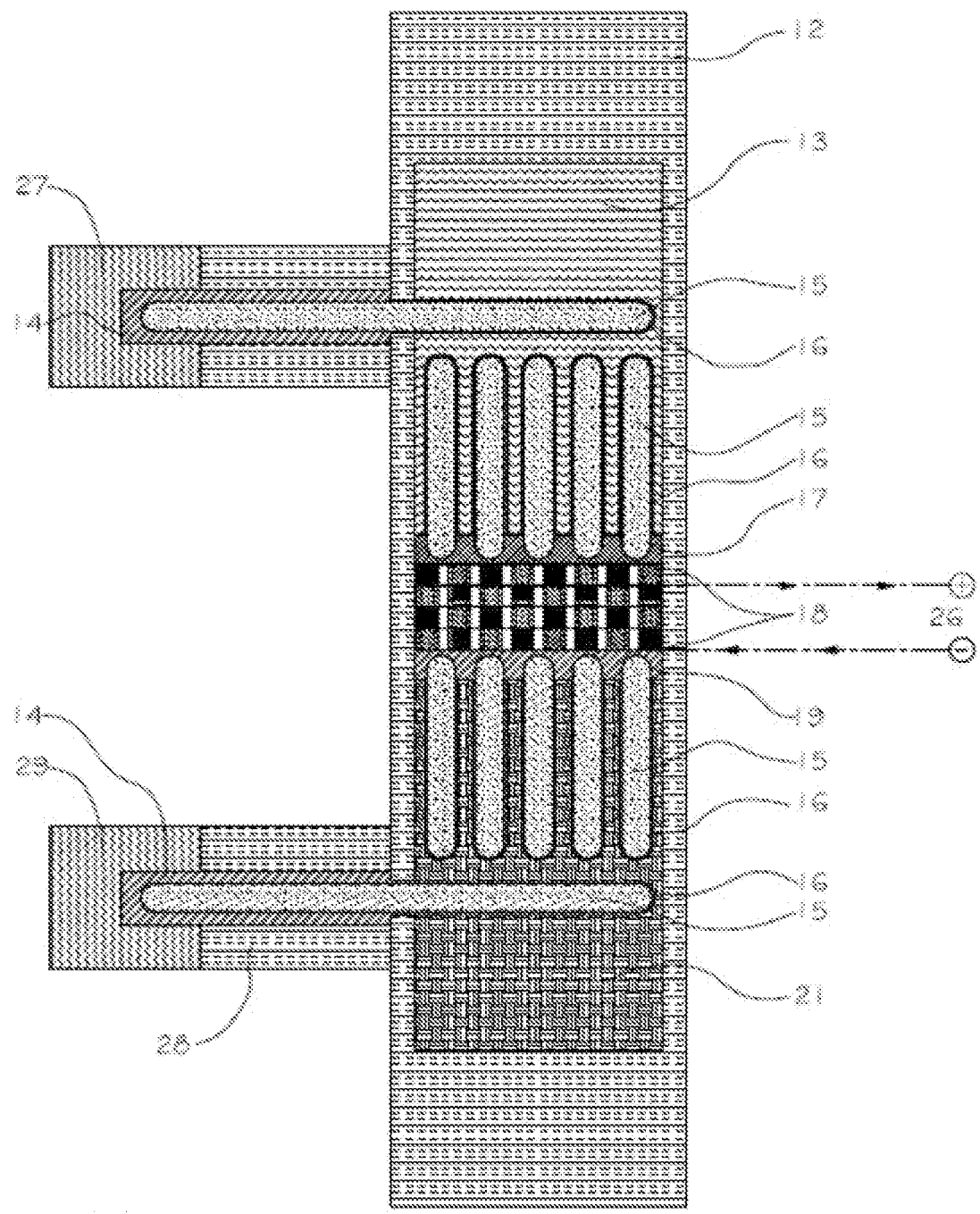
FIG. 24 is a schematic drawing of another exemplary embodiment of a thermoelectric energy generation system.

FIG. 24 is a schematic drawing of another exemplary embodiment of a thermoelectric energy generation system. Referring to FIG. 24, if there is a heat source as well as a cold source that can be harvested directly, the thermoelectric heater module stacks 22 as well as the thermoelectric chiller module stacks 24 can be eliminated and the high temperature input thermally conductive heat pipe casing 14 as well as the low temperature input thermally conductive heat pipe casing 20 can be directly attached to the waste source of high temperature thermal energy and the waste source of low temperature thermal energy respectively.

Figure 25:
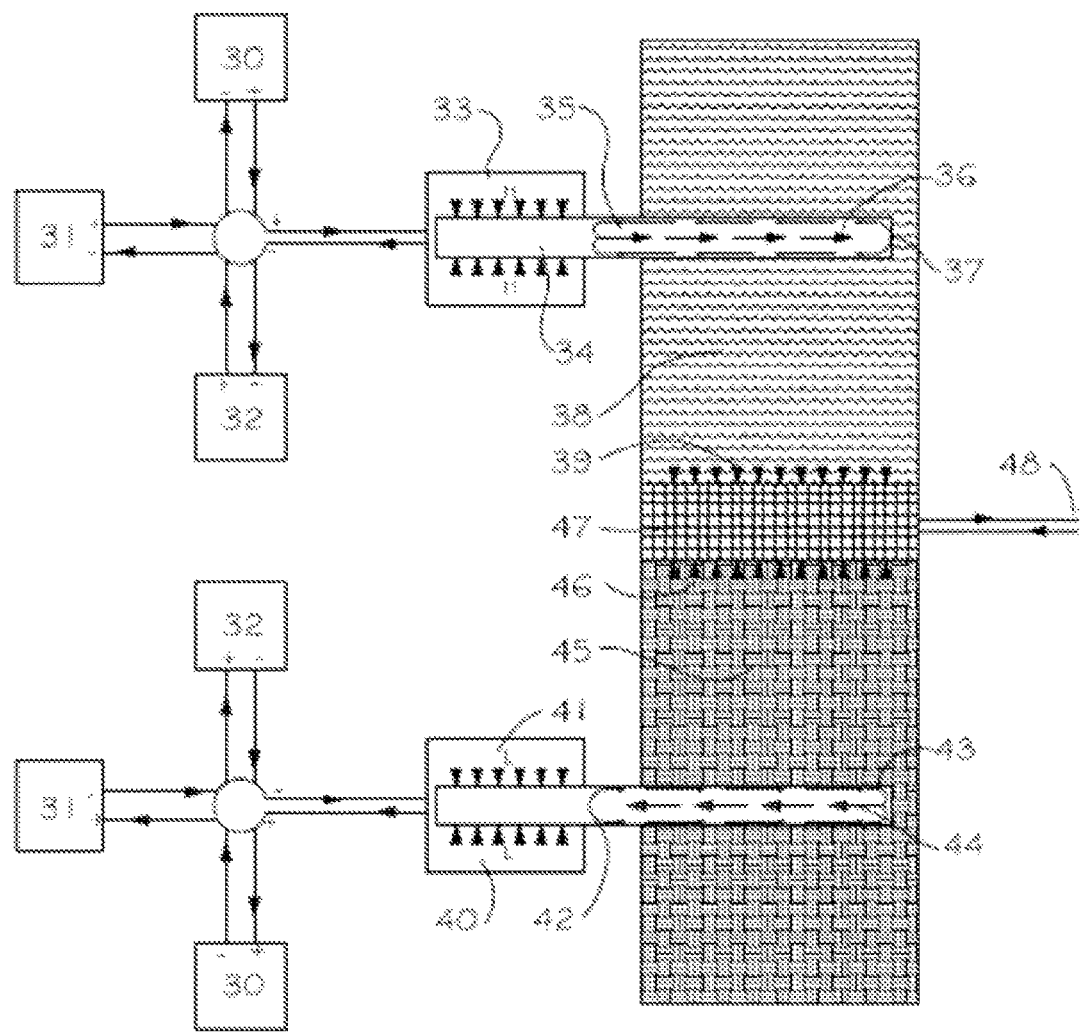
FIG. 25 is a schematic drawing of another exemplary embodiment of a thermoelectric energy generation system.

FIG. 25 is a schematic drawing of another exemplary embodiment of a thermoelectric energy generation system. Referring to FIG. 25, the need to harvest and convert additional energy to maintain the mass and thermal difference in order to achieve a constant stable electrical supply may exist to some degree in various applications. Energy harvesting using known methods such as harvested photovoltaic direct current electric energy 30, harvested piezoelectric direct current electric energy 31, and harvested electromagnet direct current electric energy 32, along with other types can power the thermoelectric heater 33. In this manner the heater 33 may heat to boiling the working fluid 34, into working fluid vapor in the high temperature heat pipe 35, that transfers it's heat into the high temperature thermal storage 38 and in so doing cools and is wicked as the condensed working fluid return 37. In exemplary embodiments, this may be used to power the thermoelectric chiller 40, to cool to freezing, working fluid 41, into chilled working fluid 43 in the low temperature heat pipe 42, that transfers it's temperature into the low temperature thermal storage 45 and in doing warms and is wicked as shown as the warmed working fluid 44. In exemplary embodiments, this process maintains a substantially constant high temperature transfer 39 and a low temperature transfer 46 in contact with opposing sides of the thermoelectric generator 47 generating a configurable, scaleable, constant, and reliable renewable source of direct current electrical output.

Figure 26:
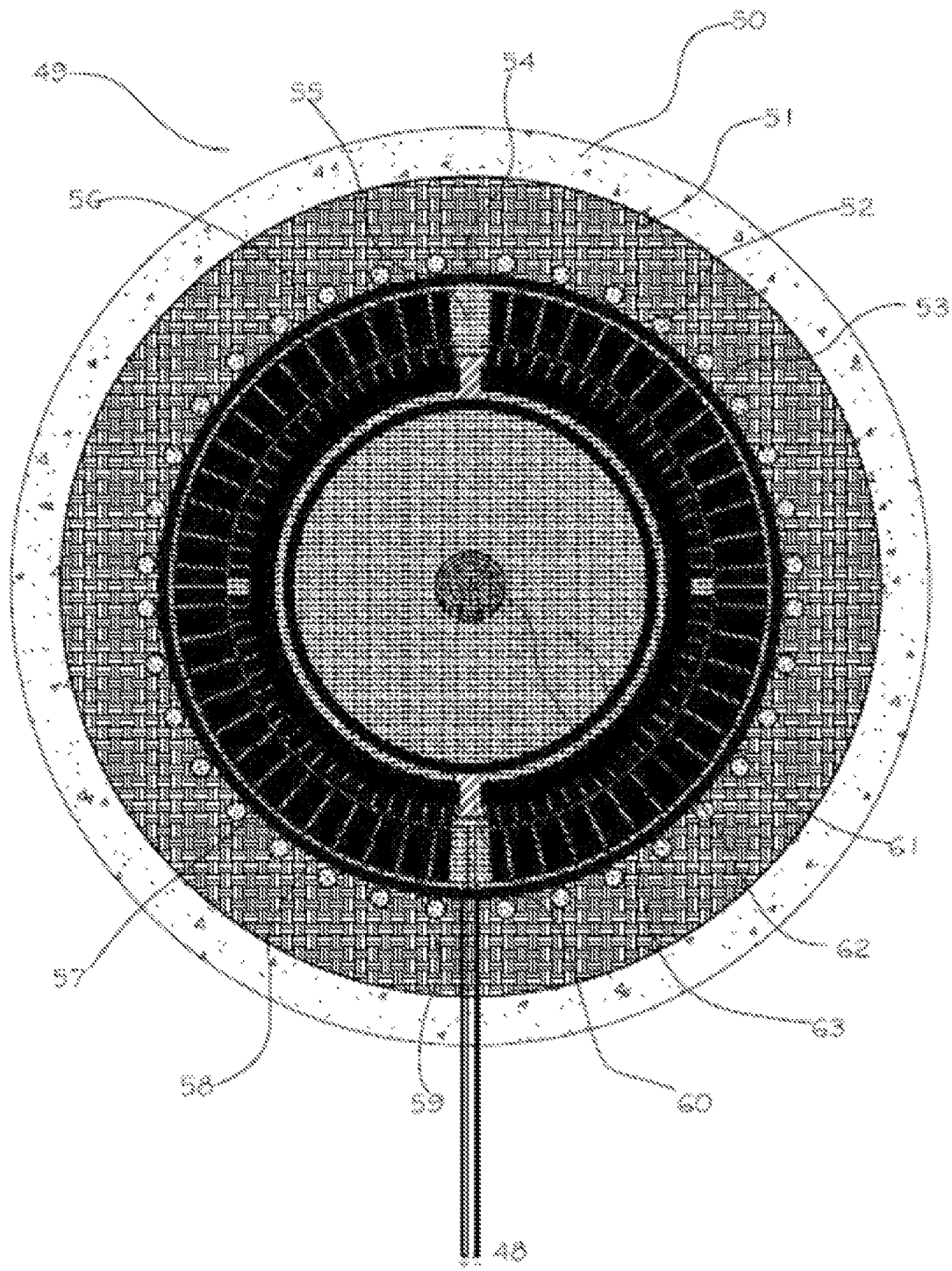
FIG. 26 is a schematic drawing of another exemplary embodiment of a thermoelectric energy generation system utilizing spent nuclear fuel rods as the harvested heat source.

FIG. 26 is a schematic drawing of another exemplary embodiment of a thermoelectric energy generation system utilizing spent nuclear fuel rods as the harvested heat source. In FIG. 26 a nuclear spent fuel rod harvested energy converter 49 absorbs thermal energy at multiple conversion energy conversion layers to generate electrical energy. In embodiments, this eliminates or substantially reduces the costly active water cooling method currently in use as well as providing a quadruple redundancy safety casket. FIG. 26 shows multiple layers beginning with the outermost reinforced concrete (e.g., 14,500 psi) outer wall with stainless steel interior liner 50, Exemplary embodiments may also comprise, a lead loaded vinyl exterior liner coated with a secondary reinforced 8,000 psi concrete wall having an outer protection layer of bituthene low temperature self-adhering, rubberized asphalt/polyethylene waterproofing membrane system of the standard type for subterranean structures, encapsulating a large volume of low temperature phase change material 51 around the entire or substantial portion of the assembly including the top and bottom of the structure. The phase change material may be integrated with heat pipes (e.g., Cu heat pipes) with low temperature working fluid (e.g., Ammonia, Acetone) 52, that extend below the transfer band through the bottom area of low temperature phase change material 51, without coming in contact with the outermost reinforced concrete 14,500 psi outer wall with stainless steel interior liner 50, in order to maintain the coldest possible (or a least a cold) temperature at the thermoelectric cold transfer location for the first thermoelectric layer. The thermoelectric layer may be comprised of multiple layers of low temperature thermoelectric generator module stacks 53 e.g., of the type described in FIG. 14, that are connected with a SiC ceramic outer seal plug 54, creating the outer evacuated chamber. In exemplary embodiments, He gas 55 may be added and that may make up the "hot" side of the first thermoelectric layer and the "cool" side of the second thermoelectric layer comprised of a liquid to vapor thermoelectric ring of SiC separated alternating chambers of HgCdTe:B and HgCdTe:P 56. In exemplary embodiments, this may be separated by a narrow vacant area within the outer evacuated chamber (which may include He gas 55), that makes up the "hot" side of the second thermoelectric layer and the "cool" side of the third and final thermoelectric layer comprised of a high temperature thermoelectric ring of separated alternating posts of SiC:Se and SiC:Sb 57, that is thermally bonded to the secondary SiC absorption wall with integrated sintered heat pipes using liquid CO2 for high temperature working fluid 58, that may extend above the transfer band through the upper area of low temperature phase change material 51, where they combine with each other in non adjacent groups of four, penetrate the upper casing into a top cavity constructed in the same manner as the outermost reinforced concrete outer wall with a stainless steel interior liner 50 and/or a lead loaded vinyl exterior liner coated with a secondary reinforced 8,000 psi concrete wall having an outer protection layer of bituthene low temperature self-adhering, rubberized asphalt/polyethylene waterproofing membrane system of the standard type for subterranean structures, to enable different working fluids to be used as the fuel rods at the center cool, in order to extend the maximum electrical generation. The chamber may be designed with dual protection hatches to remove, add or replace fuel rods using standard methods. In embodiments this may encapsulate the middle evacuated chamber (connected with vertical titanium seal plugs 60, encapsulating the primary SiC absorption wall with integrated heat pipes that use liquid CO2 working fluid 61, that may extend above the transfer band through the upper area of low temperature phase change material 51, where they combine with each other in non adjacent groups of four, penetrate the upper casing into a top cavity constructed in the same manner as the outermost reinforced concrete outer wall with a stainless steel interior liner 50 and/or a lead loaded vinyl exterior liner coated with a secondary reinforced 8,000 psi concrete wall having an outer protection layer of bituthene low temperature self-adhering, rubberized asphalt/polyethylene waterproofing membrane system of the standard type for subterranean structures, to enable different working fluids to be used as the fuel rods at the center cool, in order to extend the maximum electrical generation, forming a large area inner evacuated chamber with He gas added 62, to evenly disperse heat radiation of the spent nuclear fuel rods 63 housed within.

Figure 27:
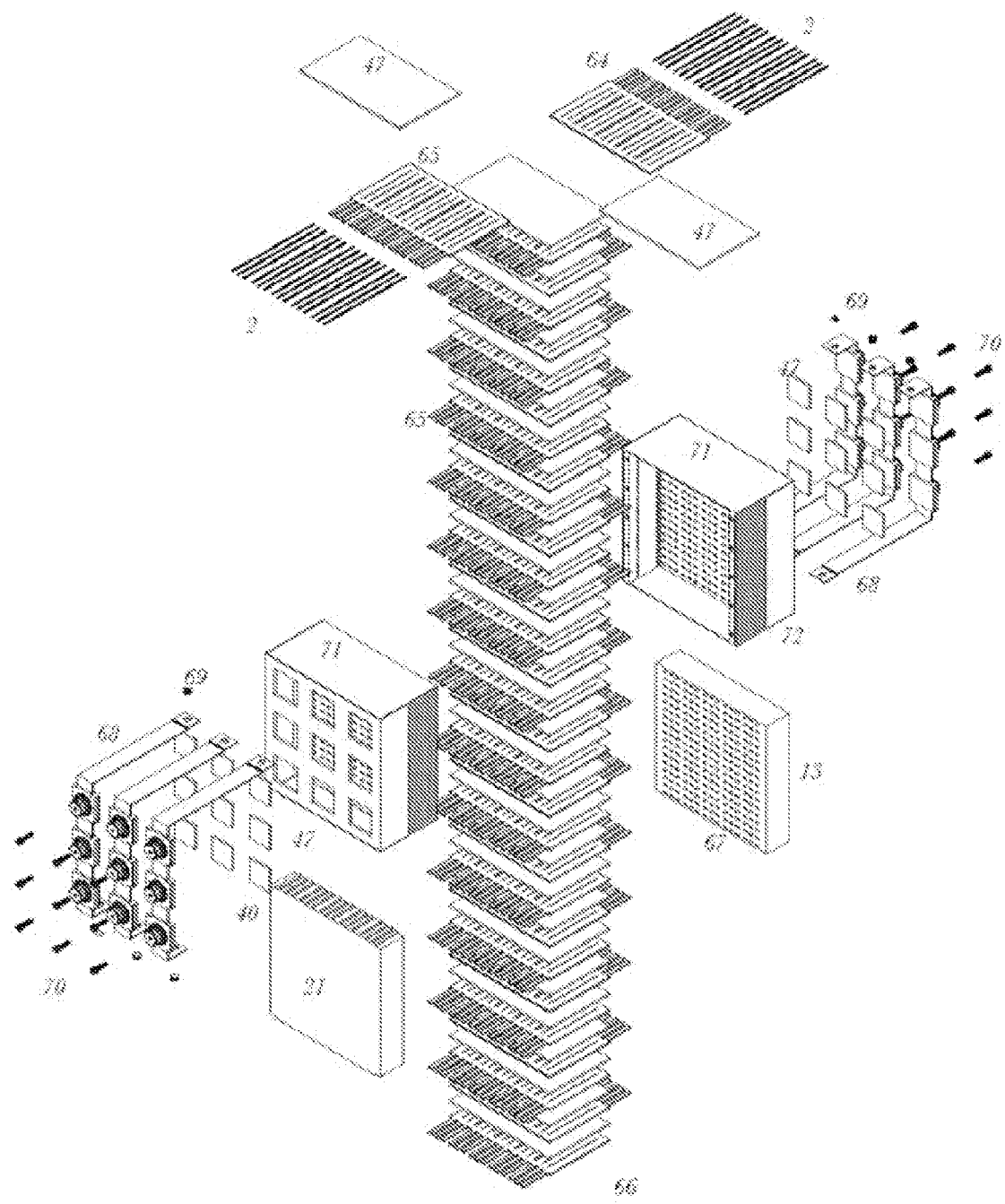
FIG. 27 is a schematic drawing of another exemplary embodiment of a thermoelectric energy generation system.

FIG. 27 is a schematic drawing of another exemplary embodiment of a thermoelectric energy generation. As seen in FIG. 27, the device includes high temperature heat plates 64 with integrated heat pipes and low temperature heat plates 65 with integrated heat pipes. Numeral 66 is the thermoelectric generator core. The device also includes a Nichrome coil heater 67 and thermally conductive outer shell strap 68. Interface 70 may be utilized to connect the device to an outside wasted or ambient thermal source. Casing 71 may be used to store phase change material.

In exemplary embodiments, another application for the technology may be to inject Nano-radios and transmitters made from single and multi walled carbon nano tubes filled with phase change material of a slightly lower temperature than the human body, a thermoelectric nano scale thermoelectric device set in between the phase change material the body so as to generate very small but needed electrical energy for medical applications (e.g., medicine delivery at cell level, growth disruptors for cancer cells, embedded micro system analyzers and transmitters)

In exemplary embodiments, the device may be used in mobile devices (cell phones, computers, displays, etc.) to harvested heat as well as ambient temperature and may also harvest ambient electromagnetic radiation and vibrations to store as opposing thermal energies using phase change materials and then converting through the thermoelectric methods described it the embodiments.

In exemplary embodiments, the device may also be used in mobile devices (cell phones, computers, displays, etc.) using the harvested heat as well as ambient temperature and may also harvest ambient electromagnetic radiation and vibrations to store as opposing thermal energies using phase change materials and then converting through the thermoelectric methods to chill the electronics for longer life and better efficiencies as described in exemplary embodiments.

In exemplary embodiments, the device could be used in electric toys to power them and using the harvested heat as well as ambient temperature and may also harvest ambient electromagnetic radiation and vibrations to store as opposing thermal energies using phase change materials and then converting through the thermoelectric methods described it exemplary embodiments.

In exemplary embodiments, the device may be used to power hand tools e.g., drills, routers, saws, or other typically battery or mains operated devices. The harvested heat as well as ambient temperature may also harvest ambient electromagnetic radiation and vibrations to store as opposing thermal energies using phase change materials and then converting through the thermoelectric methods described it the embodiments and/or to chill the electronics for longer life and better efficiencies as described in the embodiments.

In exemplary embodiments, the device could be used for emergency, security and surveillance systems that may benefit from not having to be hard wired or need batteries.

In exemplary embodiments, the device could be used for health care applications such as pacemakers, hearing aids, insulin injection apparatuses as well as monitoring and ambulatory equipment that may benefit from having a constant source of electrical energy.

In exemplary embodiments, the device could be used for appliances (refrigeration, heating, cleaning) to power the device and provide the necessary temperatures needed to complete the task the appliance was designed for, could be achieved by the methods explained in the exemplary embodiments.

In exemplary embodiments, vehicles (e.g., automobiles, aircraft, ships, boats, trains, satellites, deployment vehicles, motorcycles and other powered methods of transportation), could use the methods/devices to power the vehicle and/or its ancillary systems for long to unlimited range without the need to stop for refueling. It may be of even further benefit to the transportation industry to use the body or skin as the thermoelectric transfer point since vehicles such as ships and aircraft typically travel through colder atmospheres.

In buildings whether residential, commercial or industrial this conversion method and device would allow for immediate off grid use and also provide the heating and cooling of the occupants and water needs by the harvest of wasted energies, conversion to thermal energy and stored as thermal energy and then used on demand when converted into electrical energy.

In exemplary embodiments, technology centers are typically high energy users, using the methods in the embodiments would allow for immediate off grid use and also provide the cooling of the center's equipment.

In exemplary embodiments, lighting could be wireless if a small generator, using the harvesting, storage and conversion methods in the embodiments, was attached to individual fixtures.

In exemplary embodiments, urban vertical farming may be realized using this conversion method and would allow for immediate off grid use and also provide the heating and cooling of the agriculture air-conditioning and water needs by the harvest of wasted energies, conversion to thermal energy and stored as thermal energy and then used on demand when converted into electrical energy.

Water can be easily harvested in dry climates when there is a low cost, clean energy solution that allows high volume intake of air and compresses it into condensation chambers to extract the moisture. While the extraction method is capable of being done now, today's energy costs are too high to make it viable.

In exemplary embodiments the device may be utilized in large industrial facilities that currently use tremendous amounts of energy cooling and heating with no method of recycling the wasted thermal energies cannot store that energy and move it electrically in the factory.

In exemplary embodiments, oceanic landmass building can be achieved by running current through wire frames attracting the skeletal remains of dead sea creatures. While this method can be currently achieved, today's energy costs are too high to make it viable.

EXAMPLES

A system for converting thermal energy into electrical energy that comprises: a thermoelectric generator; a high temperature storage in contact with a first side of the thermoelectric generator; a low temperature storage in contact with a second side of the thermoelectric generator; a high temperature regenerator for maintaining the high temperature storage at a high temperature; and a low temperature regenerator for maintaining the low temperature storage at a low temperature. The difference in the temperatures of the high temperature storage and the low temperature storage creates a thermal difference between the two sides of the thermoelectric generator which creates the electrical energy.

At least one of the high temperature and low temperature storage are phase change materials.

The system generates DC current.

The system is used to power small electronic devices (e.g., cell phones, cameras, lights, tablets, computers, remote controls, televisions, mp3 players, watches, etc.

The system is used to power a vehicle in a manner that the vehicle does not require refueling.

The system is used to supplement the power delivered by the electrical grid.

The system is used to provide power to a ship or vessel and uses the ambient temperature of the body of water.

The system is used to provide heating or cooling with or without electrical generation being a part of the system.

The high temperature regenerator comprises: a thermoelectric generator that uses the high temperature storage on one side and an ambient temperature on the other side to create a temperature difference across the thermoelectric generator. The thermal difference across the thermoelectric generator generates electrical energy.

The electrical energy of the high temperature regenerator is used to power a heater to keep the high temperature storage at a high temperature.

The low temperature regenerator comprises: a thermoelectric generator that uses the low temperature storage on one side and an ambient temperature on the other side to create a temperature difference across the thermoelectric generator. The thermal difference across the thermoelectric generator generates electrical energy.

The electrical energy of the low temperature regenerator is used to power a chiller to keep the low temperature storage at a low temperature.

In the description of exemplary embodiments of this disclosure, various features are sometimes grouped together in a single embodiment, figure or description thereof for the purpose of streamlining the disclosure and aiding in the understanding of one or more of the various disclosed aspects. This method of disclosure, however, is not to be interpreted as reflecting an intention that the claimed inventions requires more features than are expressly recited in each claim. Rather, as the following claims reflect, inventive aspects may lie in less than all features of a single foregoing disclosed embodiment. Thus, the claims following the Detailed Description are hereby expressly incorporated into this Description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art.

Although the present disclosure makes particular reference to exemplary embodiments thereof, variations and modifications can be effected within the spirit and scope of the following claims.

What is claimed is:

1. A system for converting thermal energy into electrical energy, the system comprising:
   a thermoelectric generator;
   a high temperature storage in contact with a first side of the thermoelectric generator;
   a low temperature storage in contact with a second side of the thermoelectric generator;
   a high temperature regenerator for maintaining the high temperature storage at a high temperature; and
   a low temperature regenerator for maintaining the low temperature storage at a low temperature; and
   wherein the temperature of the high temperature storage is higher than the temperature of the low temperature storage and the difference in the temperatures of the high temperature storage and the low temperature storage creates a thermal difference between the two sides of the thermoelectric generator which creates the electrical energy; and wherein the high temperature storage is positioned between the first side of the thermoelectric generator and the high temperature regenerator and the low temperature storage is positioned between the second side of the thermoelectric generator and the low temperature regenerator;

wherein the high temperature regenerator comprises:

a second thermoelectric generator that uses the high temperature storage on one side and a lower ambient temperature on the other side to create a temperature difference across the second thermoelectric generator;

wherein the thermal difference across the second thermoelectric generator generates electrical energy.

2. The system of claim 1 wherein the high temperature storage and low temperature storage are phase change materials.

3. The system of claim 1 wherein the electrical energy is DC current.

4. The system of claim 1 wherein the thermally stored energy is used to heat or cool another application.

5. The system of claim 1 wherein the electrical energy of the high temperature regenerator is used to power a heater to keep the high temperature storage at a high temperature.

6. The system of claim 1 wherein the low temperature regenerator comprises:

a third thermoelectric generator that uses the low temperature storage on one side and an ambient temperature on the other side to create a temperature difference across the third thermoelectric generator;

wherein the thermal difference across the third thermoelectric generator generates electrical energy.

7. The system of claim 5 wherein the electrical energy of the low temperature regenerator is used to power a chiller to keep the low temperature storage at a low temperature.

* * * * *